(12) United States Patent
Hsu et al.

(10) Patent No.: US 11,916,060 B2
(45) Date of Patent: Feb. 27, 2024

(54) SEMICONDUCTOR DEVICE HAVING IMPROVED ELECTROSTATIC DISCHARGE PROTECTION

(71) Applicant: Taiwan Semiconductor Manufacturing Company, Ltd., Hsin-Chu (TW)

(72) Inventors: Sheng-Fu Hsu, Hsinchu (TW);
Ta-Yuan Kung, New Taipei (TW);
Chen-Liang Chu, Hsin-Chu (TW);
Chih-Chung Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/845,159

(22) Filed: Jun. 21, 2022

(65) Prior Publication Data
US 2022/0320071 A1 Oct. 6, 2022

Related U.S. Application Data

(62) Division of application No. 17/004,396, filed on Aug. 27, 2020, now Pat. No. 11,393,809.
(Continued)

(51) Int. Cl.
*H01L 21/00* (2006.01)
*H01L 27/02* (2006.01)
(Continued)

(52) U.S. Cl.
CPC .... *H01L 27/0251* (2013.01); *H01L 21/28052* (2013.01); *H01L 21/28097* (2013.01);
(Continued)

(58) Field of Classification Search
CPC ............. H01L 29/7833; H01L 29/7835; H01L 21/28052
See application file for complete search history.

(56) References Cited

U.S. PATENT DOCUMENTS

| 10,008,492 B2 | 6/2018 | Huang et al. |
| 2004/0038485 A1* | 2/2004 | Pong ................... H01L 29/7835 |
| | | 257/E29.268 |

(Continued)

OTHER PUBLICATIONS

Non-Final Office Action dated Nov. 8, 2021 for U.S. Appl. No. 17/004,396.
(Continued)

*Primary Examiner* — Reema Patel
(74) *Attorney, Agent, or Firm* — Eschweiler & Potashnik, LLC

(57) ABSTRACT

Various embodiments of the present disclosure are directed towards a semiconductor device. The semiconductor device comprises a source region and a drain region in a substrate and laterally spaced. A gate stack is over the substrate and between the source region and the drain region. The drain region includes two or more first doped regions having a first doping type in the substrate. The drain region further includes one or more second doped regions in the substrate. The first doped regions have a greater concentration of first doping type dopants than the second doped regions, and each of the second doped regions is disposed laterally between two neighboring first doped regions.

20 Claims, 20 Drawing Sheets

Related U.S. Application Data

(60) Provisional application No. 62/949,575, filed on Dec. 18, 2019.

(51) Int. Cl.
  *H01L 21/28* (2006.01)
  *H01L 21/285* (2006.01)
  *H01L 29/06* (2006.01)
  *H01L 29/49* (2006.01)
  *H01L 29/66* (2006.01)

(52) U.S. Cl.
  CPC .... *H01L 21/28518* (2013.01); *H01L 29/0649* (2013.01); *H01L 29/4933* (2013.01); *H01L 29/66659* (2013.01)

(56) References Cited

U.S. PATENT DOCUMENTS

| | | | |
|---|---|---|---|
| 2005/0083075 A1 | 4/2005 | Su et al. | |
| 2005/0242399 A1* | 11/2005 | Huang | H01L 29/7843 |
| | | | 257/E27.06 |
| 2006/0081924 A1 | 4/2006 | Ichikawa | |
| 2006/0214223 A1* | 9/2006 | Sasaki | H01L 29/66659 |
| | | | 257/E29.268 |
| 2008/0211028 A1* | 9/2008 | Suzuki | H01L 27/0266 |
| | | | 257/E21.409 |
| 2013/0207184 A1 | 8/2013 | Chen et al. | |
| 2017/0062554 A1 | 3/2017 | Tan et al. | |
| 2018/0138167 A1 | 5/2018 | Huang et al. | |
| 2018/0219093 A1* | 8/2018 | Chou | H01L 23/49562 |

OTHER PUBLICATIONS

Notice of Allowance dated Mar. 4, 2022 for U.S. Appl. No. 17/004,396.

1 Notice of Allowance dated Mar. 15, 2023 for U.S. Appl. No. 17/845,121.

* cited by examiner

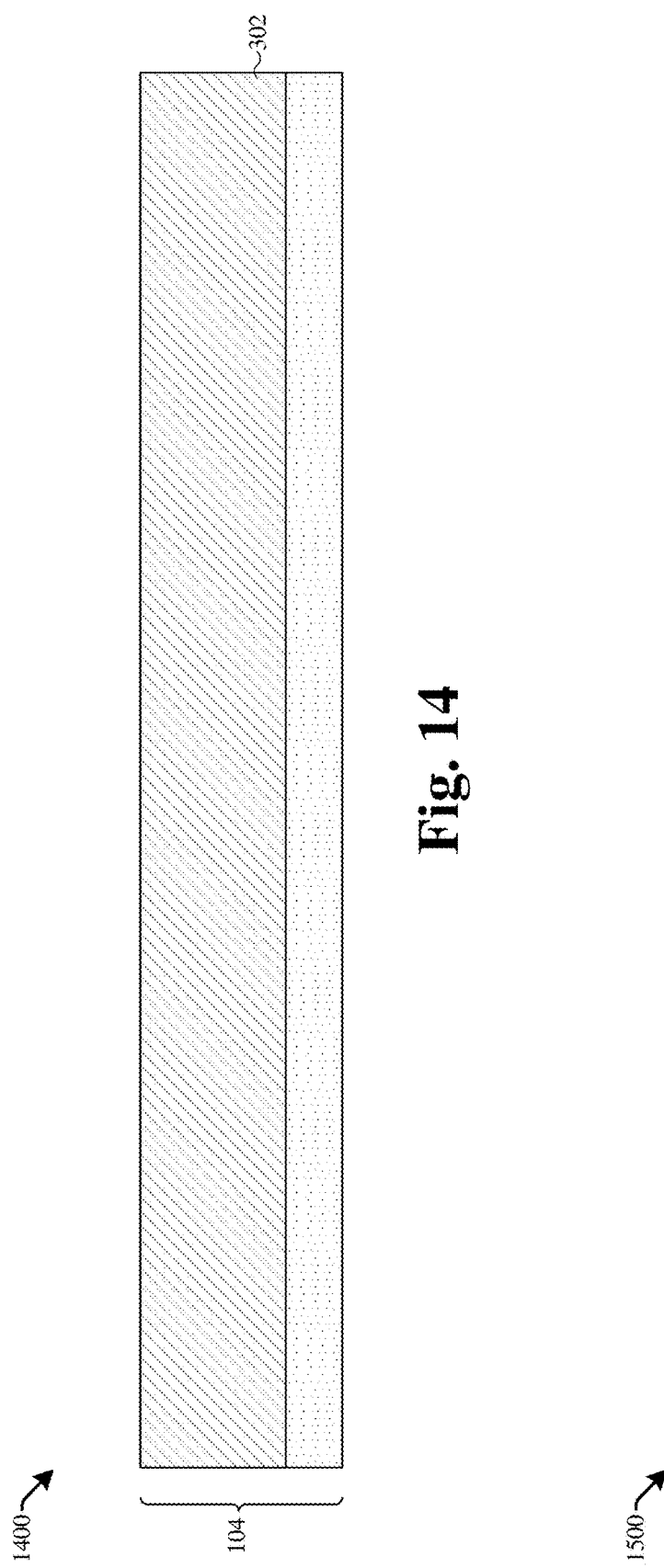
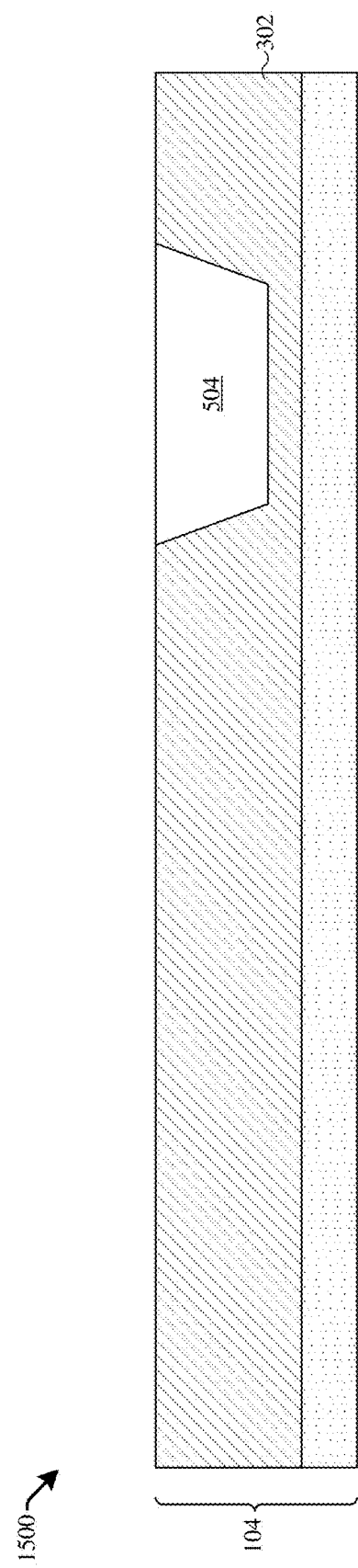
Fig. 14
Fig. 15

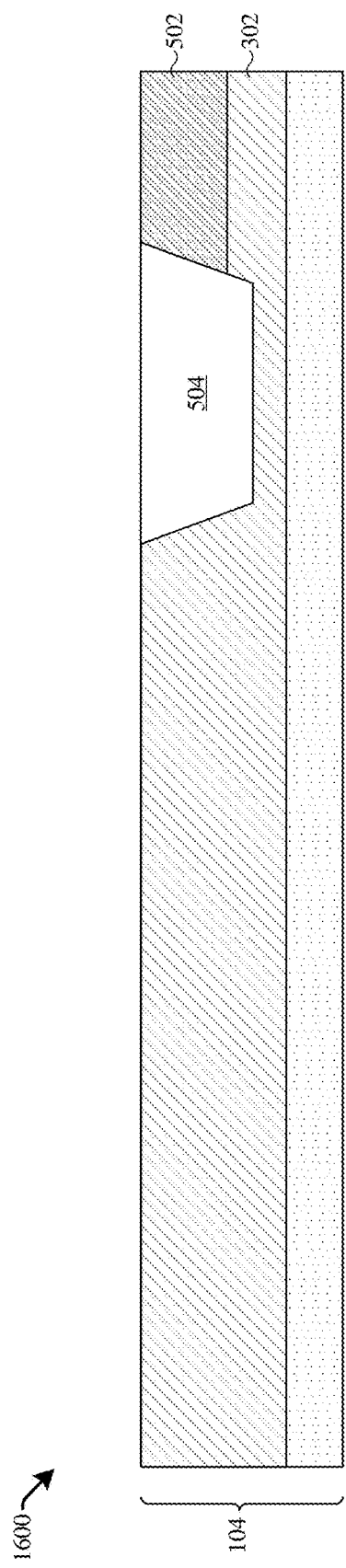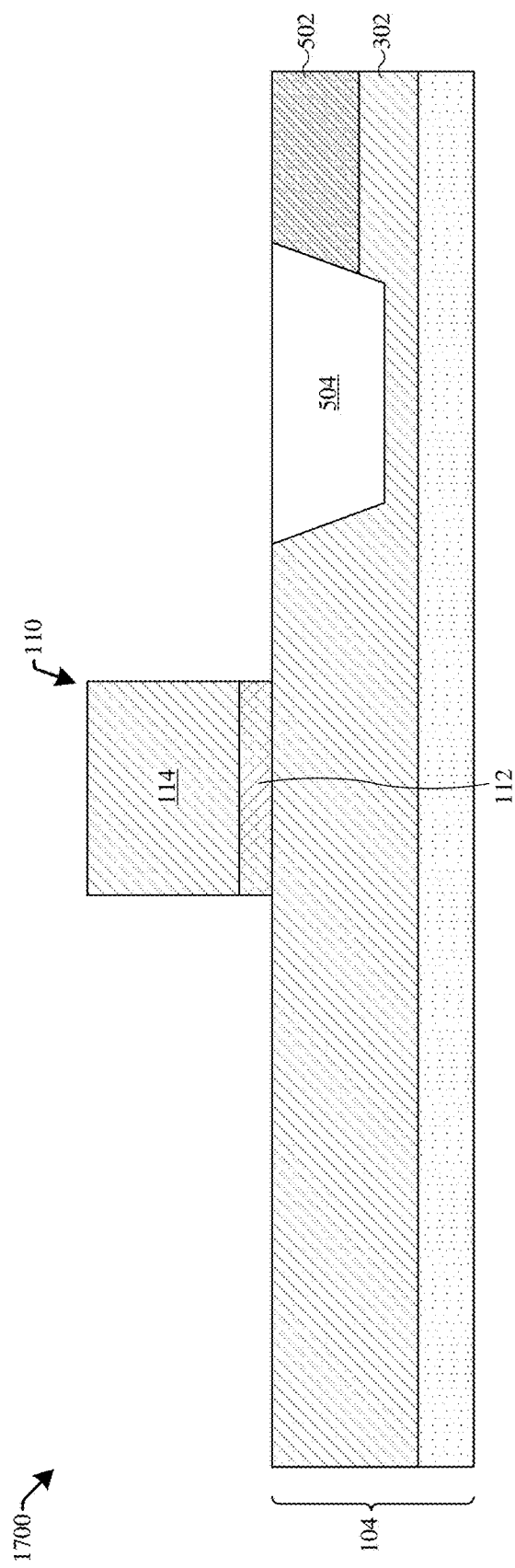
Fig. 16
Fig. 17

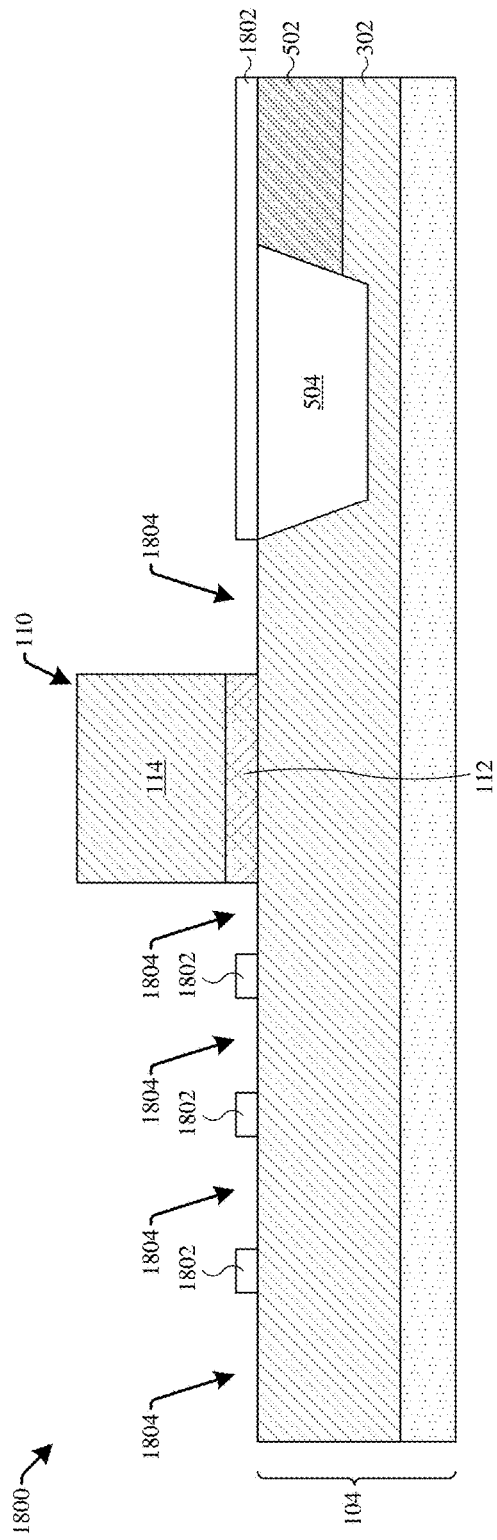
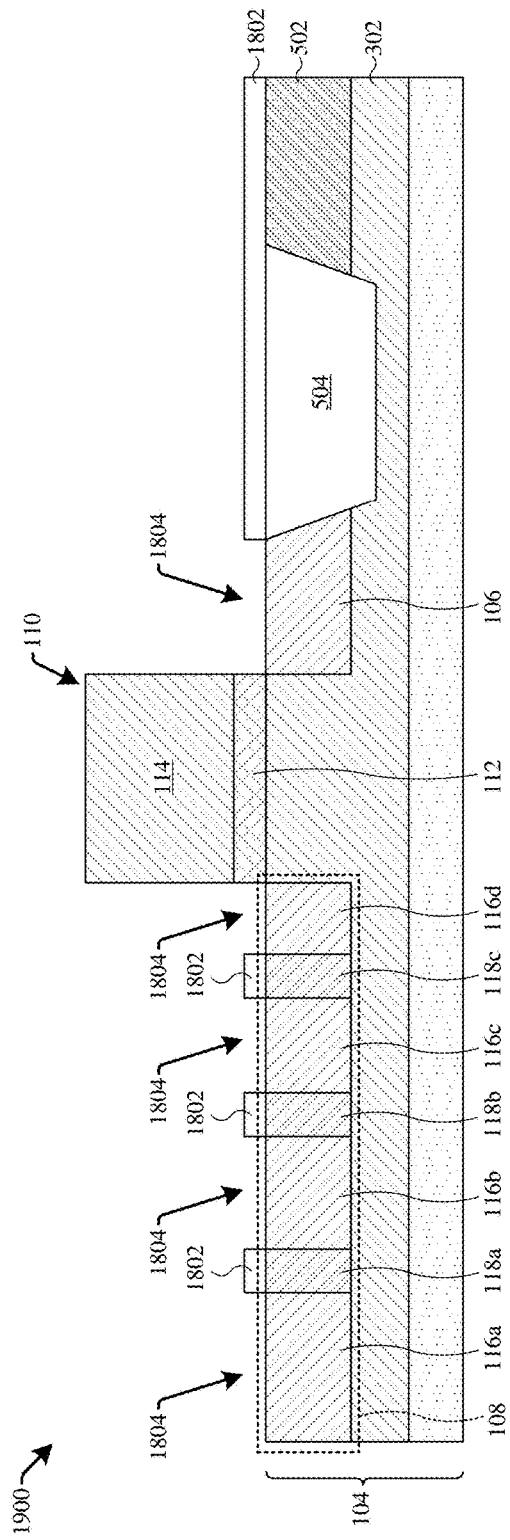
Fig. 18
Fig. 19

SEMICONDUCTOR DEVICE HAVING IMPROVED ELECTROSTATIC DISCHARGE PROTECTION

REFERENCE TO RELATED APPLICATIONS

This Application is a Divisional of U.S. application Ser. No. 17/004,396, filed on Aug. 27, 2020, which claims the benefit of U.S. Provisional Application No. 62/949,575, filed on Dec. 18, 2019. The contents of the above-referenced Patent Applications are hereby incorporated by reference in their entirety.

BACKGROUND

Modern day integrated chips (ICs) comprise millions or billions of semiconductor devices on a semiconductor substrate (e.g., silicon). Electrostatic discharge (ESD) is a sudden release of electrostatic charge which can result in high electric fields and currents within an IC. ESD pulses can damage the semiconductor devices, for example by "blowing out" a gate dielectric of a transistor or by "melting" an active region of the device. If the semiconductor devices are damaged by an ESD pulse, the IC can be rendered less operable than desired, or can even be rendered inoperable altogether.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14-23 illustrates a series of cross-sectionals views of some embodiments of a method for forming an IC comprising a semiconductor device that has improved ESD performance.

DETAILED DESCRIPTION

Figure 1:
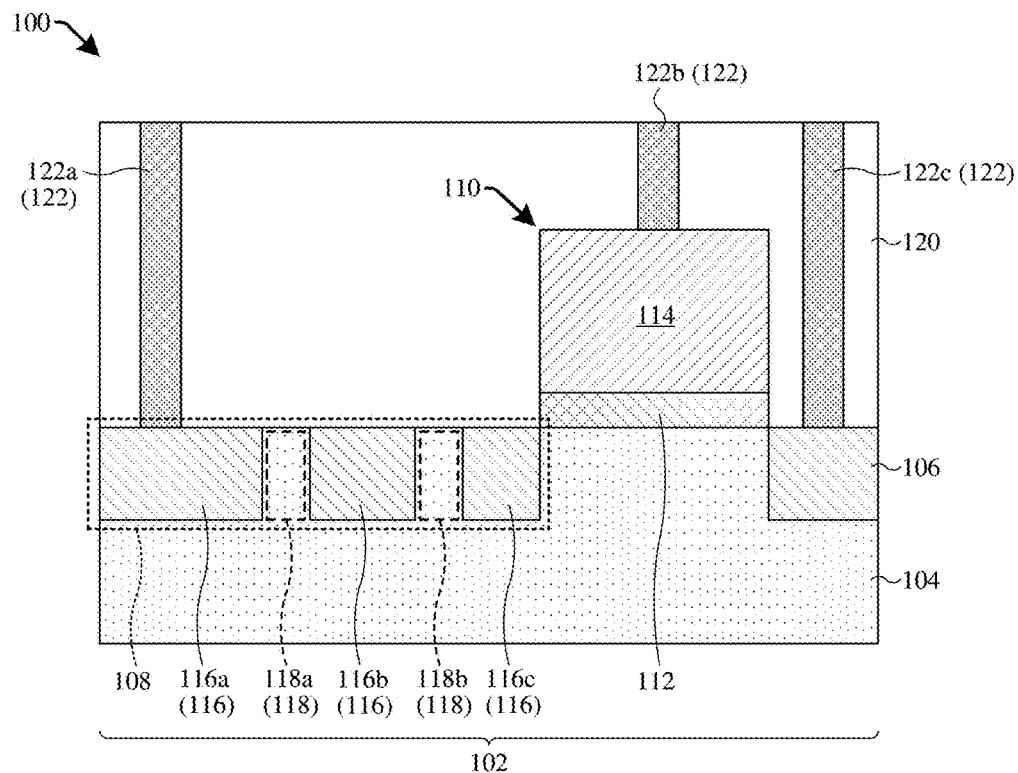
FIG. 1 illustrates a cross-sectional view of some embodiments of an integrated chip (IC) comprising a semiconductor device that has improved electrostatic discharge (ESD) performance.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips (ICs) comprise a plurality of semiconductor devices (e.g., field-effect transistors (FETs)). In some embodiments, a semiconductor device of the plurality of semiconductor devices is a metal-oxide-semiconductor field-effect transistor (MOSFET). The semiconductor device comprises a source region and a drain region disposed in a semiconductor substrate. Further, a gate stack, which comprises a gate electrode overlying a gate dielectric, is disposed over the semiconductor substrate between the drain region and the source region. Typically, the drain region corresponds to a single doped region of the semiconductor substrate. The single doped region has a first side that is substantially aligned with a side (e.g., sidewall) of the gate stack, and the single doped region extends continuously through the semiconductor substrate to a second side of the single doped region opposite the first side. The single doped region has a doping concentration of first doping type dopants (e.g., n-type dopants) that is substantially the same from the first side of the single doped region to the second side of the single doped region.

Further, the ICs comprise a plurality of input/output (I/O) structures (e.g., bond pads, solder bumps, etc.). The plurality of I/O structures are configured to provide electrical connections between an IC and its package (e.g., through-hole packages, surface mount packages, chip carrier packages, pin grid array packages, small outline packages, flat packages, chip-scale packages, ball grid array packages, etc.). In some embodiments, an I/O structure of the plurality of I/O structures is configured as an open-drain I/O structures (e.g., an open-drain output pad). In such embodiments, the IC comprises an open-drain buffer circuit comprising the semiconductor device.

The open-drain buffer circuit is configured to provide a low impedance state or a high impedance state depending on an input from one or more other semiconductor devices of the IC (e.g., internal IC logic devices). For example, the drain region of the semiconductor device is electrically coupled to the I/O structure, the source region of the semiconductor device is electrically coupled to ground (e.g., 0 volts (V)), and the gate electrode of the semiconductor device is electrically coupled to an internal IC logic device (e.g., the one or more other semiconductor devices of the IC). Thus, based on an output from the internal IC logic device, the semiconductor device is either "ON" (e.g., conducting) or "OFF" (e.g., not conducting). For example, if the internal IC logic device outputs a high signal (e.g., logic "1") to the gate electrode, the semiconductor device is "ON" and electrically couples the I/O structure to ground, thereby resulting in the open-drain buffer circuit providing a low impedance state (e.g., logic "0"). On the other hand, if the internal IC logic device outputs a low signal (e.g., logic "0") to the gate electrode, the semiconductor device is "OFF" and the I/O structure is disconnected from ground, thereby resulting in the open-drain buffer circuit providing a high impedance state. Typically, a resistor (e.g., a pull-up resistor that is internal or external to the IC) is connected to a positive voltage terminal (e.g., Vdd) and the I/O structure. Accordingly, when the open-drain buffer circuit provides the high impedance state, the positive voltage is provided to the I/O structure (e.g., logic "1").

One challenge with the IC is the susceptibility of the IC to be damaged by an electrostatic discharge (ESD) pulse. For example, if an ESD event occurs, the ESD pulse may catastrophically damage the IC (e.g., "blowing out" gate dielectrics, "melting" active regions, etc.). One commonly used model for characterizing the susceptibility of an IC to damage from an ESD pulse is the human-body model (HBM). For certain applications (e.g., HBM ESD class 2 devices), the IC must pass the HBM test at a predefined ESD pulse voltage (e.g., 2,000 V). One potential failure point of the IC during the HBM test is the semiconductor device of the open-drain buffer circuit.

For example, during the HBM test, an ESD pulse is applied to the IC. The ESD pulse may propagate through the IC (e.g., the I/O structure) to the semiconductor device of the open-drain buffer circuit. The ESD pulse causes a voltage spike on the drain region of the semiconductor device that may catastrophically damage the semiconductor substrate (e.g., "blowing out" the gate dielectric of the semiconductor device due to a gate-to-drain voltage exceeding a threshold voltage), thereby resulting in damage to the IC and failure of the HBM test at the predefined ESD pulse voltage. The voltage spike on the drain region of the semiconductor substrate may catastrophically damage the semiconductor substrate due to the voltage being greater than the threshold voltage at the first side of the single doped region (e.g., at this location the voltage difference between the gate and drain will cause the gate dielectric to "blow out"). There are several partial solutions to improve (e.g., increase) the ESD protection of the semiconductor device of the open-drain buffer circuit (e.g., increasing drain restive protective oxide width, adding a gate-to-source resistor, increasing device width, enlarging active region to pick-up well spacing, etc.), but none of these partially solutions have provided the necessary ESD protection to satisfy the IC specifications for certain applications (e.g., HBM ESD class 2 and greater devices that utilize open-drain output pins). Thus, a semiconductor device having improved (e.g., increased) ESD protection would be desirable to prevent failure of the semiconductor device of the open-drain buffer circuit.

Various embodiments of the present application are directed toward an IC comprising a semiconductor device (e.g., a MOSFET of an open-drain buffer circuit) that has improved ESD protection. The semiconductor device comprises a source region in a substrate. A drain region is in the substrate and laterally spaced from the source region. A gate stack, which comprises a gate electrode overlying a gate dielectric, is over the substrate and between the source region and the drain region. The drain region comprises two or more first doped regions having a first doping type in the substrate. Further, the drain region comprises one or more second doped regions in the substrate. The first doped regions have a greater concentration of first doping type dopants than the second doped regions, and each of the second doped regions is disposed laterally between two neighboring first doped regions.

Because the drain region comprises the two or more first doped regions and the one or more second doped regions, a resistance across the drain region is high. For example, a first one of the first doped regions is spaced further away from the gate stack than any other of the first doped regions, and a second one of the first doped regions is spaced nearer the gate stack than any of the other first doped regions. Because the first doped regions have a greater concentration of first doping type dopants than the second doped regions, and because each of the second doped regions is disposed laterally between two neighboring first doped regions, a resistance between the first one of the first doped regions and the second one of the first doped regions is high. Therefore, if an ESD pulse propagates through the IC to the semiconductor device, thereby causing a voltage spike on the first one of the first doped regions, the voltage at the second one of the first doped regions will be low (e.g., due to the high resistance of the drain region dropping the voltage). Thus, the voltage at the second one of the first device regions may be smaller than a threshold voltage (e.g., a voltage that would result in "blowing out" of the gate dielectric). Accordingly, the semiconductor device has improved (e.g., increased) ESD protection. Thus, the IC comprising the semiconductor device having improved ESD protection may meet or exceed the IC specifications for certain applications (e.g., HBM ESD class 2 and greater devices).

FIG. 1 illustrates a cross-sectional view 100 of some embodiments of an integrated chip (IC) comprising a semiconductor device 102 that has improved electrostatic discharge (ESD) performance.

As shown in the cross-sectional view 100 of FIG. 1, the IC comprises a substrate 104. The substrate 104 comprises any type of semiconductor body (e.g., monocrystalline silicon/CMOS bulk, germanium (Ge), silicon-germanium (SiGe), gallium arsenide (GaAs), silicon on insulator (SOI), etc.). The substrate 104 may be doped (e.g., with n-type or p-type dopants) or undoped (e.g., intrinsic). In some embodiments, the substrate 104 has a first doping type (e.g., p-type).

The semiconductor device comprises a source region 106, a drain region 108, and a gate stack 110. The source region 106 and the drain region 108 are in the substrate 104 and laterally spaced. The source region 106 is a region of the substrate 104 having a second doping type (e.g., n-type) different than the first doping type.

The gate stack 110 overlies the substrate 104 between the source region 106 and the drain region 108. The gate stack 110 comprises a gate dielectric 112 and a conductive gate electrode 114. The gate dielectric 112 is disposed on the substrate 104, and the conductive gate electrode 114 overlies the gate dielectric 112. In some embodiments, sidewalls of the gate dielectric 112 are substantially aligned with sidewalls of the conductive gate electrode 114.

In some embodiments, the conductive gate electrode 114 comprises polysilicon. In such embodiments, the gate dielectric 112 may comprise or be, for example, an oxide (e.g., silicon dioxide ($SiO_2$)), a nitride (e.g., silicon nitride (SiN)), or the like. In other embodiments, the conductive gate electrode 114 may be or comprise a metal, such as aluminum (Al), copper (Cu), titanium (Ti), tantalum (Ta), tungsten (W), molybdenum (Mo), cobalt (Co), or the like. In such embodiments, the gate dielectric 112 may comprise a high-k dielectric material, such as hafnium oxide (HfO), tantalum oxide (TaO), hafnium silicon oxide (HfSiO), hafnium tantalum oxide (HMO), aluminum oxide (AlO), zirconium oxide (ZrO), or the like.

In some embodiments, the source region 106 has a first side that is substantially aligned with a side (e.g., sidewall) of the gate stack 110. In some embodiments, the source region 106 corresponds to a single doped region of the substrate 104. In further embodiments, the single doped region of the substrate 104 that corresponds to the source region 106 has a doping concentration of second doping type dopants (e.g., n-type dopants, such as phosphorus (P), arsenic (As), antimony (Sb), or the like) that is substantially the same from the first side of the source region 106 to a second side of the source region 106 opposite the first side of the source region 106.

The drain region 108 comprises two or more first doped regions 116 and one or more second doped regions 118 of the substrate 104. The first doped regions 116 correspond to doped regions of the substrate 104, and the second doped regions 118 correspond to other doped regions of the substrate 104. For example, the first doped regions 116 comprise a first doped region 116a, a second doped region 116b, and a third doped region 116c of the substrate 104, and the second doped regions 118 comprise a fourth doped region 118a and a fifth doped region 118b of the substrate 104. The drain region 108 comprises a first number of individual first doped regions 116, and the drain region 108 comprises a second number of individual second doped regions 118. The first number is any integer greater than or equal to two (2). The second number is equal to the first number minus one (1). For example, the cross-sectional view 100 of FIG. 1 illustrates the drain region 108 comprising three (3) individual first doped regions 116 (e.g., the first doped region 116a, the second doped region 116b, and the third doped region 116c) and comprising two (2) individual second doped regions 118 (e.g., the fourth doped region 118a and the fifth doped region 118b). While the cross-sectional view 100 of FIG. 1 illustrates the drain region 108 comprising three (3) individual first doped regions 116 and two (2) individual second doped regions 118, it will be appreciated that the drain region 108 may comprise any other combination of the first doped regions 116 and the second doped regions 118, such as two (2) individual first doped regions 116 and one (1) individual second doped regions 118, four (4) individual first doped regions 116 and three (3) individual second doped regions 118, five (5) individual first doped regions 116 and four (4) individual second doped regions 118, and so forth.

Each of the second doped regions 118 is disposed (e.g., directly disposed) laterally between two neighboring first doped regions of the first doped regions 116. For example, the first doped region 116a neighbors the second doped region 116b, and the fourth doped region 118a is disposed laterally between the first doped region 116a and the second doped region 116b. The third doped region 116c neighbors the second doped region 116b on a different side of the second doped region 116b as the first doped region 116a, and the fifth doped region 118b is disposed laterally between the second doped region 116b and the third doped region 116c.

The first doped regions 116 have the second doping type (e.g., n-type). In some embodiments, the second doped regions 118 have the first doping type (e.g., p-type). In other embodiments, the second doped regions 118 have the second doping type. The first doped regions 116 have a greater concentration of second doping type dopants (e.g., n-type dopants, such as phosphorus (P), arsenic (As), antimony (Sb), or the like) than the second doped regions 118. For example, the first doped regions 116 have a first concentration of the second doping type dopants, and the second doped regions 118 have a second concentration of second doping type dopants that is less than the first doping concertation of the second doping type dopants.

An interlayer dielectric (ILD) structure 120 is disposed over the substrate 104, the source region 106, the drain region 108, and the gate stack 110. The ILD structure 120 comprises one or more stacked ILD layers, which may respectively comprise a low-k dielectric (e.g., a dielectric material with a dielectric constant less than about 3.9), an oxide (e.g., silicon dioxide ($SiO_2$)), an oxy-nitride (e.g., silicon oxy-nitride (SiON)), doped silicon dioxide (e.g., carbon doped silicon dioxide), borosilicate glass (BSG), phosphoric silicate glass (PSG), borophosphosilicate glass (BPSG), fluorinated silicate glass (FSG), or the like.

A plurality of conductive contacts 122 (e.g., metal contacts) are disposed in the ILD structure 120 and over the substrate 104. The conductive contacts 122 extend vertically from the substrate 104 and the gate stack 110. For example, the conductive contacts 122 comprise a first conductive contact 122a, a second conductive contact 122b, and a third conductive contact 112c. The first conductive contact 122a is electrically coupled to the drain region 108 and vertically extends from the drain region 108. The second conductive contact 122b is electrically coupled to the conductive gate electrode 114. The third conductive contact 122c is electrically coupled to the source region 106 and vertically extends from the source region 106. More specifically, the first conductive contact 122a is electrically coupled to and extends vertically from the first doped region 116a of the drain region 108. The conductive contacts 122 may be or comprise, for example, tungsten (W), copper (Cu), aluminum (Al), some other conductive material, or a combination of the foregoing.

Because the drain region 108 comprises the two or more first doped regions 116 and the one or more second doped regions 118, a resistance across the drain region 108 is high. For example, because the first doped regions 116 have a greater concentration of the second doping type dopants than the second doped regions 118, and because each of the second doped regions 118 is disposed laterally between two neighboring first doped regions of the first doped regions 116, a resistance between the first doped region 116a and the third doped region 116c is high. More specifically, because the first doped region 116a and the second doped region 116b have a greater concentration of the second doping type dopants than the fourth doped region 118a, and because the fourth doped region 118a is disposed laterally between the first doped region 116a and the second doped region 116b, a resistance between the first doped region 116a and the second doped region 116b is high, which causes the resistance across the drain region 108 to be high. Further, because the second doped region 116b and the third doped region 116c have a greater concentration of the second doping type dopants than the fifth doped region 118b, and because the fifth doped region 118b is disposed laterally between the second doped region 116b and the third doped region 116c, a resistance between the second doped region 116b and the third doped region 116c is also high, which causes the resistance across the drain region 108 to be even higher.

Therefore, if an ESD pulse propagates through the IC to the semiconductor device 102, thereby causing a voltage spike on the first doped region 116a, the voltage at the third doped region 116c will be low (e.g., due to the high resistance across the drain region 108 dropping the voltage). Thus, the voltage at the third doped region 116c may be smaller than a threshold voltage (e.g., a voltage that would result in "blowing out" of the gate dielectric 112). Accordingly, the semiconductor device 102 has improved (e.g., increased) ESD protection (e.g., the semiconductor device 102 can withstand an ESD pulse having a voltage greater than or equal to about 2,000 V). Thus, the IC comprising the semiconductor device 102 may meet or exceed IC specifications for certain specific applications (e.g., HBM ESD class 2 and greater devices that utilize open-drain output pins).

Figure 2:
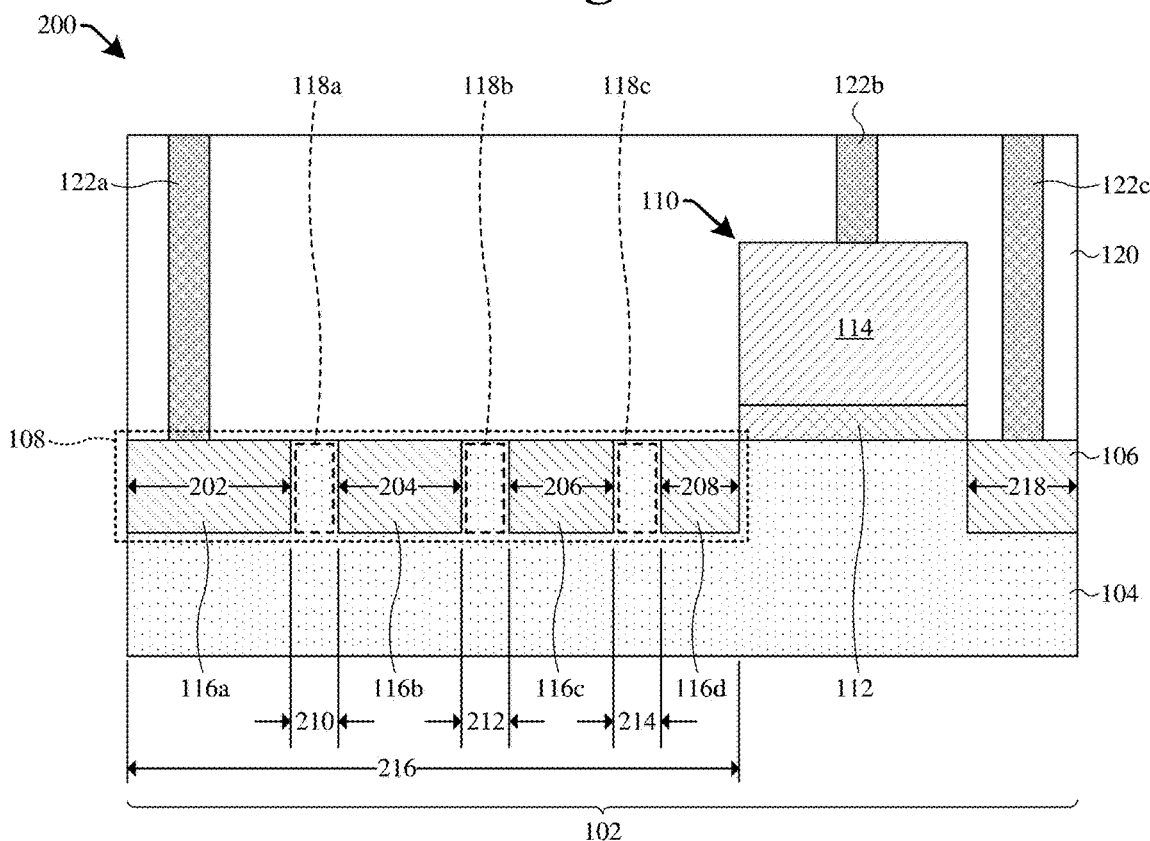
FIG. 2 illustrates a cross-sectional view of some other embodiments of the IC of FIG. 1.

FIG. 2 illustrates a cross-sectional view 200 of some other embodiments of the IC of FIG. 1.

As shown in the cross-sectional view 200 of FIG. 2, the drain region 108 comprises two or more first doped regions 116 and one or more second doped regions 118 of the substrate 104. For example, the first doped regions 116 comprise the first doped region 116a, the second doped region 116b, the third doped region 116c, and a sixth doped region 116d of the substrate 104, and the second doped regions 118 comprise the fourth doped region 118a, the fifth doped region 118b, and a seventh doped region 118c of the substrate 104. Each of the second doped regions 118 is disposed between two neighboring first doped regions of the first doped regions 116.

The drain region 108 comprises a first number of individual first doped regions 116, and the drain region 108 comprises a second number of individual second doped regions 118. In some embodiments, the first number is any between two (2) and (4). The second number is equal to the first number minus one (1). For example, the cross-sectional view 200 of FIG. 2 illustrates the drain region 108 comprising four (4) individual first doped regions 116 (e.g., the first doped region 116a, the second doped region 116b, the third doped region 116c, and the sixth doped region 116d) and comprising three (3) individual second doped regions 118 (e.g., the fourth doped region 118a, the fifth doped region 118b, and the seventh doped region 118c). In some embodiments, if the drain region 108 comprises more than four (4) individual first doped regions 116, the resistance across the drain region 108 may be too high, such that the semiconductor device 102 cannot output a strong enough electrical signal (e.g., voltage). In further embodiments, if the drain region 108 comprises less than two (2) individual first doped regions 116, the resistance across the drain region 108 may be too low, such that the semiconductor device 102 has poor ESD protection (e.g., the IC is damaged with an ESD pulse having less than about 2,000 V).

In some embodiments, a side of the drain region 108 is substantially aligned with a side (e.g., sidewall) of the gate stack 110. More specifically, a side of the sixth doped region 116d is substantially aligned with the side of the gate stack 110. For example, the side of the sixth doped region 116d is substantially aligned with a side (e.g., sidewall) of the gate dielectric 112 and/or a side (e.g., sidewall) of the conductive gate electrode 114. While the cross-sectional view 200 of FIG. 2 illustrates the side of the sixth doped region 116d substantially aligned with the side of the gate stack 110, it will be appreciated that whichever one of the first doped regions 116 is disposed nearer the gate stack 110 than any other of the first doped regions 116 may be substantially aligned with the side of the gate stack 110.

Each of the first doped regions 116 have a width. For example, the first doped region 116a has a first width 202, the second doped region 116b has a second width 204, the third doped region 116c has a third width 206, and the sixth doped region 116d has a fourth width 208. In some embodiments, the widths of the first doped regions 116 are substantially the same. For example, the first width 202, the second width 204, the third width 206, and the fourth width 208 are substantially the same. In other embodiments, one or more of the first doped regions 116 have a different width than another one of the first doped regions 116. For example, in some embodiments, the first width 202 may be different than the second width 204, the third width 206, and/or the fourth width 208; the second width 204 may be different than the first width 202, the third width 206, and/or the fourth width 208; the third width 206 may be different than the first width 202, the second width 204, and/or the fourth width 208; and/or the fourth width 208 may be different than the first width 202, the second width 204, and/or the third width 206. In some embodiments, the widths of the first doped regions 116 may increase the further the first doped regions 116 are spaced from the gate stack 110. For example, as shown in the cross-sectional view 200 of FIG. 2, the third width 206 is greater than the fourth width 208, the second width 204 is greater than the third width 206, and the first width 202 is greater than the second width 204.

Each of the second doped regions 118 have a width. For example, the fourth doped region 118a has a fifth width 210, the fifth doped region 118b has a sixth width 212, and the seventh doped region 118c has a seventh width 214. In some embodiments, the widths of the second doped regions 118 are between about 0.1 micrometers (um) and about 0.3 um. For example, the fifth width 210 is between about 0.1 um and about 0.3 um, the sixth width 212 is between about 0.1 um and about 0.3 um, and the seventh width 214 is between about 0.1 um and about 0.3 um. In some embodiments, if the widths of the second doped regions 118 are greater than about 0.3 um, the resistance across the drain region 108 may be too high, such that the semiconductor device 102 cannot output a strong enough electrical signal (e.g., voltage). In further embodiments, if the widths of the second doped regions 118 are less than about 0.1 um, the resistance across the drain region 108 may be too low, such that the semiconductor device 102 has poor ESD protection. It will be appreciated that, in other embodiments, the widths of the second doped regions 118 may be less than about 0.1 um or greater than about 0.3 um (e.g., because the widths of the second doped regions 118 at least partially determine the resistance across the drain region 108, and the resistance across the drain region 108 needed to have good semiconductor performance (e.g., a strong output voltage) and good ESD protection (e.g., the semiconductor device 102 can withstand an ESD pulse having a voltage greater than or equal to about 2,000 V) is dependent upon predefined IC specifications).

In some embodiments, the widths of the second doped regions 118 are substantially the same. For example, the fifth width 210, the sixth width 212, and the seventh width 214 are substantially the same (e.g., some value between about 0.1 um and about 0.3 um). In other embodiments, one or more of the second doped regions 118 have a different width than another one of the second doped regions 118. For example, in some embodiments, the fifth width 210 may be different than the sixth width 212 and/or the seventh width 214, the sixth width 212 may be different than the fifth width 210 and/or the seventh width 214, and/or the seventh width 214 may be different than the fifth width 210 and/or the sixth width 212.

The widths of the second doped regions 118 are less than one or more of the widths of the first doped regions 116. For example, the fifth width 210, the sixth width 212, and the seventh width 214 are each less than one or more of the first width 202, the second width 204, the third width 206, and the fourth width 208. In some embodiments, the widths of the second doped regions 118 are less than a smallest width of the widths of the first doped regions 116. For example, if the fourth width 208 is the smallest width out of the first width 202, the second width 204, the third width 206, and the fourth width 208, each of the fifth width 210, the sixth width 212, and the seventh width 214 are less than the fourth width 208. In some embodiments, if the widths of the second doped regions 118 are greater than the smallest width of the widths of the first doped regions 116, the resistance across the drain region 108 may be too high, such that the semiconductor device 102 cannot output a strong enough electrical signal. In further embodiments, if the widths of the second doped regions 118 are less than the smallest width of the widths of the first doped regions 116, the resistance across the drain region 108 may be too low, such that the semiconductor device 102 has poor ESD protection.

The drain region 108 has an eighth width 216. In some embodiments, the eighth width 216 is an overall width of the drain region 108. In such embodiments, the eighth width 216 is equal to a sum of the widths of the first doped regions 116 and the second doped regions 118. The source region 106 has a ninth width 218. In some embodiments, the ninth width 218 is an overall width of the source region 106. In further embodiments, the ninth width 218 is less than the eighth width 216.

Figure 3:
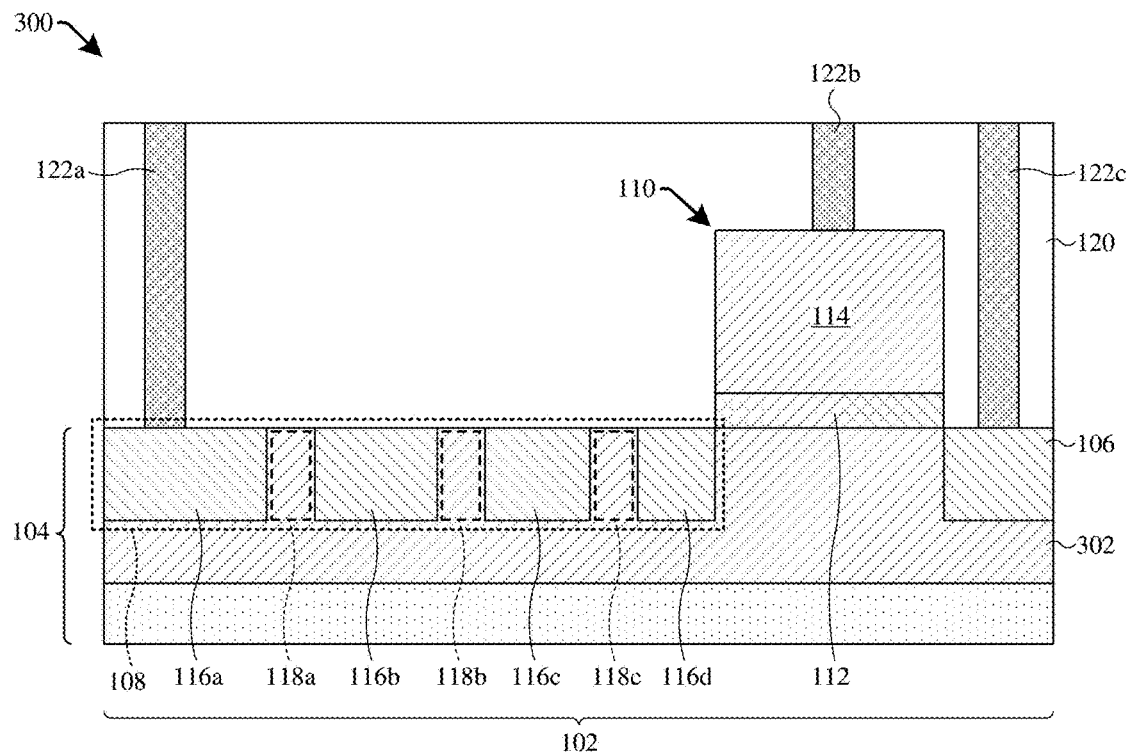
FIG. 3 illustrates a cross-sectional view of some other embodiments of the IC of FIG. 1.

FIG. 3 illustrates a cross-sectional view 300 of some other embodiments of the IC of FIG. 1.

As shown in the cross-sectional view 300 of FIG. 3, a well region 302 is disposed in the substrate 104. The well region 302 is a doped region of the substrate 104 having the first doping type (e.g., p-type). In other words, the well region 302 has the first doping type. In some embodiments, the well region 302 and the substrate 104 have the first doping type. In further embodiments, the well region 302 has a greater concentration of first doping type dopants (e.g., p-type dopants, such as boron (B), aluminum (Al), gallium (Ga), or the like) than adjoining regions of the substrate 104.

The source region 106 and the drain region 108 are disposed in the well region 302. The gate stack 110 is disposed over the well region 302 and between the source region 106 and the drain region 108. In some embodiments, as illustrated in the cross-sectional view 300 of FIG. 3, the second doped regions 118 have the first doping type and are portions of the well region 302 disposed laterally between the first doped regions 116.

Figure 4:
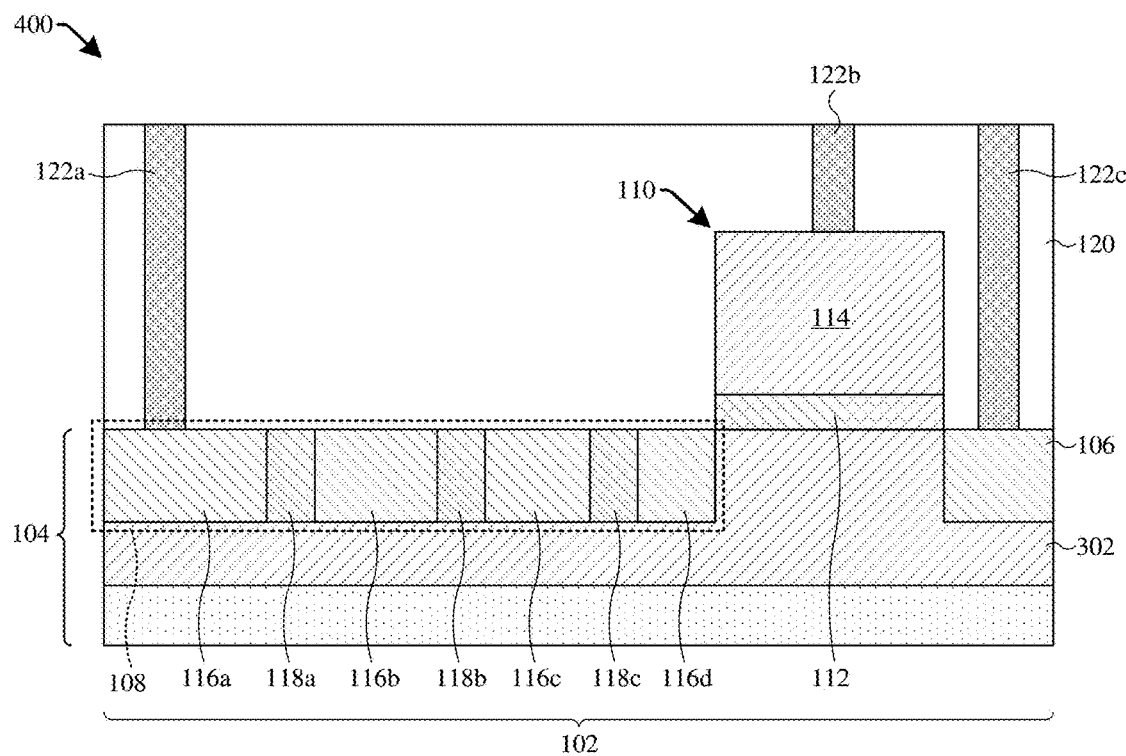
FIG. 4 illustrates a cross-sectional view of some other embodiments of the IC of FIG. 1.

FIG. 4 illustrates a cross-sectional view 400 of some other embodiments of the IC of FIG. 1.

As shown in the cross-sectional view 400 of FIG. 4, the second doped regions 118 have the second doping type (e.g., n-type), and the first doped regions 116 also have the second n-type doping type. In other words, the first doped regions 116 correspond to doped regions of the substrate 104 having the second doping type, and the second doped regions 118 correspond to other doped regions of the substrate 104 that also have the second doping type. While the second doped regions 118 and the first doped regions 116 both have the second doping type, the first doped regions 116 still have a greater concentration of the second doping type dopants than the second doped regions 118. In some embodiments, if the first doped regions 116 and the second doped regions 118 have a same concentration of the second doping type dopants, the resistance across the drain region 108 may be too low, such that the semiconductor device 102 has poor ESD protection. In further embodiments, if the second doped regions 118 have a greater concentration of the second doping type dopants than the first doped regions 116, the semiconductor device 102 may have poor ESD protection and/or poor device performance (e.g., due to a high resistance between the first conductive contact 122a and the first doped region 116a). In some embodiments, as illustrated in the cross-sectional view 400 of FIG. 4, the second doped regions 118 are disposed in the well region 302. In other embodiments, the well region 302 is omitted.

Figure 5:
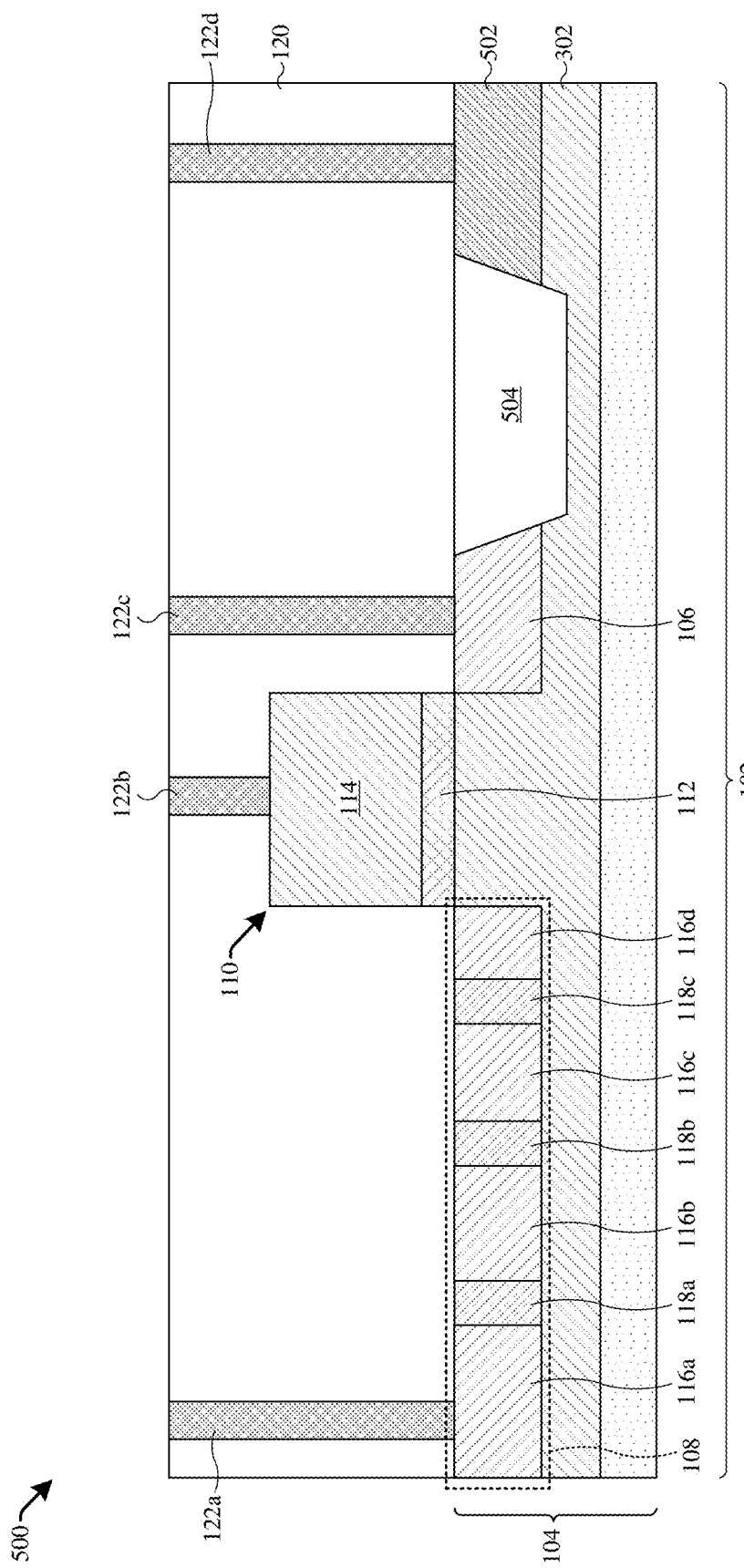
FIG. 5 illustrates a cross-sectional view of some other embodiments of the IC of FIG. 1.

FIG. 5 illustrates a cross-sectional view 500 of some other embodiments of the IC of FIG. 1.

As shown in the cross-sectional view 500 of FIG. 5, a pick-up region 502 is disposed in the substrate 104. In some embodiments, the pick-up region 502 is disposed in the well region 302. The pick-up region 502 is a region of the substrate 104 having the first doping type (e.g., p-type). In other words, the pick-up region 502 has the first doping type. The pick-up region 502 has a greater concentration of the first doping type dopants than the well region 302 (or the substrate 104). The pick-up region 502 is laterally spaced from the source region 106. The source region 106 is disposed between the pick-up region 502 and the gate stack 110.

The pick-up region 502 is configured to provide a low resistance path between the well region 302 (or the substrate 104) and a corresponding one of the conductive contacts 122. For example, the conductive contacts comprise a fourth conductive contact 122d. The fourth conductive contact 122d is electrically coupled to the pick-up region 502 and extends vertically from the pick-up region 502. The pick-up region 502 is configured to provide a low resistance path between the well region 302 (or the substrate 104) and the fourth conductive contact 122d.

An isolation structure 504 is disposed in the substrate 104. In some embodiments, the isolation structure 504 is disposed in the well region 302. The isolation structure 504 may be or comprise, for example, an oxide (e.g., $SiO_2$), some other dielectric material, or a combination of the foregoing. In some embodiments, the isolation structure 504 may comprise one or more liner layers (e.g., a silicon nitride (SiN) liner layer). The isolation structure 504 may be, for example, a shallow trench isolation (STI) structure. The isolation structure 504 is laterally disposed between the pick-up region 502 and the source region 106. In some embodiments, the isolation structure 504 laterally surrounds the source region 106, the gate stack 110, and the drain region 108. In such embodiments, a portion of the isolation structure 504 is laterally disposed between the source region 106 and the pick-up region 502. In further embodiments, the isolation structure 504 may also laterally surround the pick-up region 502.

Figure 6:
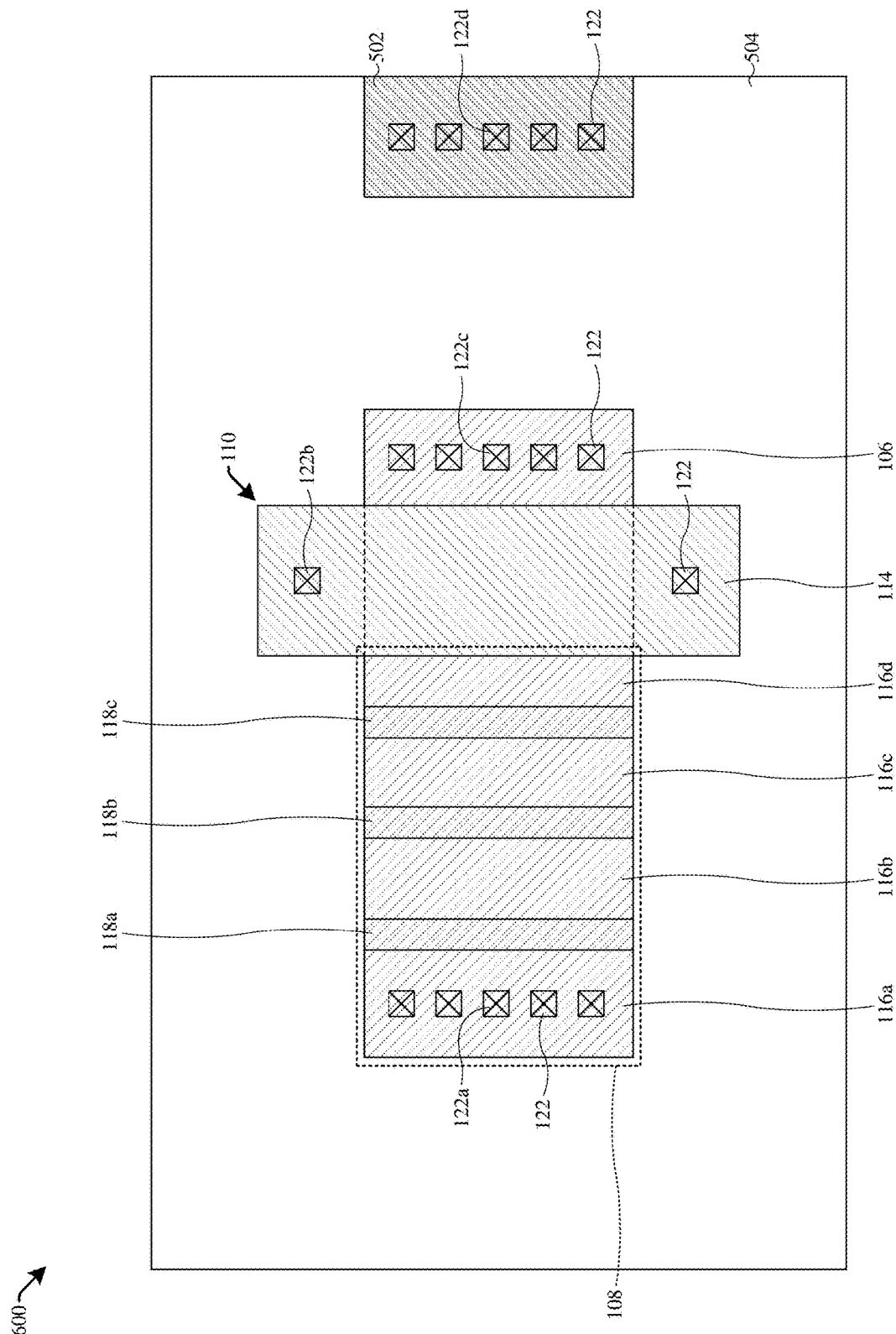
FIG. 6 illustrates a simplified top view of some embodiments of the IC of FIG. 5.

FIG. 6 illustrates a simplified top view 600 of some embodiments of the IC of FIG. 5. The simplified top view 600 of FIG. 6 is "simplified" because the simplified top view 600 of FIG. 6 does not illustrate the ILD structure 120 and because each of the conductive contacts 122 are illustrated as an "X" confined within a box.

As shown in the simplified top view 600 of FIG. 6, the isolation structure 504 laterally surrounds the source region 106, the gate stack 110, and the drain region 108. As such, a first portion of the isolation structure 504 is disposed between the source region 106 and the pick-up region 502, a second portion of the isolation structure 504 is disposed on an opposite side of the drain region 108 as the first portion of the isolation structure 504, a third portion of the isolation structure 504 extends laterally from the first portion of the isolation structure 504 to the second portion of the isolation structure 504, and a fourth portion of the isolation structure 504, which is opposite the third portion of the isolation structure 504, also extends laterally from the first portion of the isolation structure 504 to the second portion of the isolation structure 504. In some embodiments, the gate stack 110 may partially cover the third portion of the isolation structure 504 and/or the fourth portion of the isolation structure 504. In other words, the gate stack 110 may overlie a segment of the third portion of the isolation structure 504 and/or a segment of the fourth portion of the isolation structure 504. For example, as shown in the simplified top view 600 of FIG. 6, the gate stack 110 partially covers the third portion of the isolation structure 504 and the fourth portion of the isolation structure 504 (e.g., the dotted lines extending laterally through the gate stack 110 illustrate edges of the isolation structure 504). In other embodiments, the gate stack 110 may not overlie the isolation structure 504.

Also shown in the simplified top view 600 of FIG. 6, additional conductive contacts 122 may be electrically coupled to the substrate 104 or the gate stack 110. For example, as shown in the simplified top view 600 of FIG. 6, five (5) individual conductive contacts 122 are electrically coupled to the drain region 108, two (2) individual conductive contacts 122 are electrically coupled to the conductive gate electrode 114, five (5) individual conductive contacts 122 are electrically coupled the source region 106, and five (5) individual conductive contacts 122 are electrically coupled to the pick-up region 502. It will be appreciated that any number of individual may be electrically coupled to the substrate 104 or the gate stack 110.

Also shown in the simplified top view 600 of FIG. 6, the conductive contacts 122 that are electrically coupled to the conductive gate electrode 114 may extend vertically from the conductive gate electrode 114 at locations that are disposed over (e.g., directly over) the isolation structure 504. For example, as shown in the simplified top view 600 of FIG. 6, the second conductive contact 122b extends vertically from the conductive gate electrode 114 at a location that is disposed over (e.g., directly over) the isolation structure 504. In other words, the conductive contacts 122 that are electrically coupled to the conductive gate electrode 114 may extend vertically from locations that are disposed outside an inner perimeter of the isolation structure 504 in which the source region 106 and the drain region 108 are disposed within. In other embodiments, one or more of the conductive contacts 122 that are electrically coupled to the conductive gate electrode 114 may extend vertically from locations that are disposed inside the inner perimeter of the isolation structure 504 in which the source region 106 and the drain region 108 are disposed within.

Also shown in the simplified top view 600 of FIG. 6, in some embodiments, none of the conductive contacts 122 are electrically coupled to the second doped region 116b, the third doped region 116c, the sixth doped region 116d, or any of the second doped regions 118. Rather, the only conductive contacts 122 that are electrically coupled to the drain region 108 are electrically coupled to the one of the first doped regions 116 that is spaced the furthest from the gate stack 110. For example, as shown in the simplified top view 600 of FIG. 6, the only conductive contacts 122 that are electrically coupled to the drain region 108 are electrically coupled to the first doped region 116a. In such embodiments, the ILD structure 120 (see, e.g., FIG. 5) completely covers the second doped region 116b, the third doped region 116c, the sixth doped region 116d, and each of the second doped regions 118.

Figure 7:
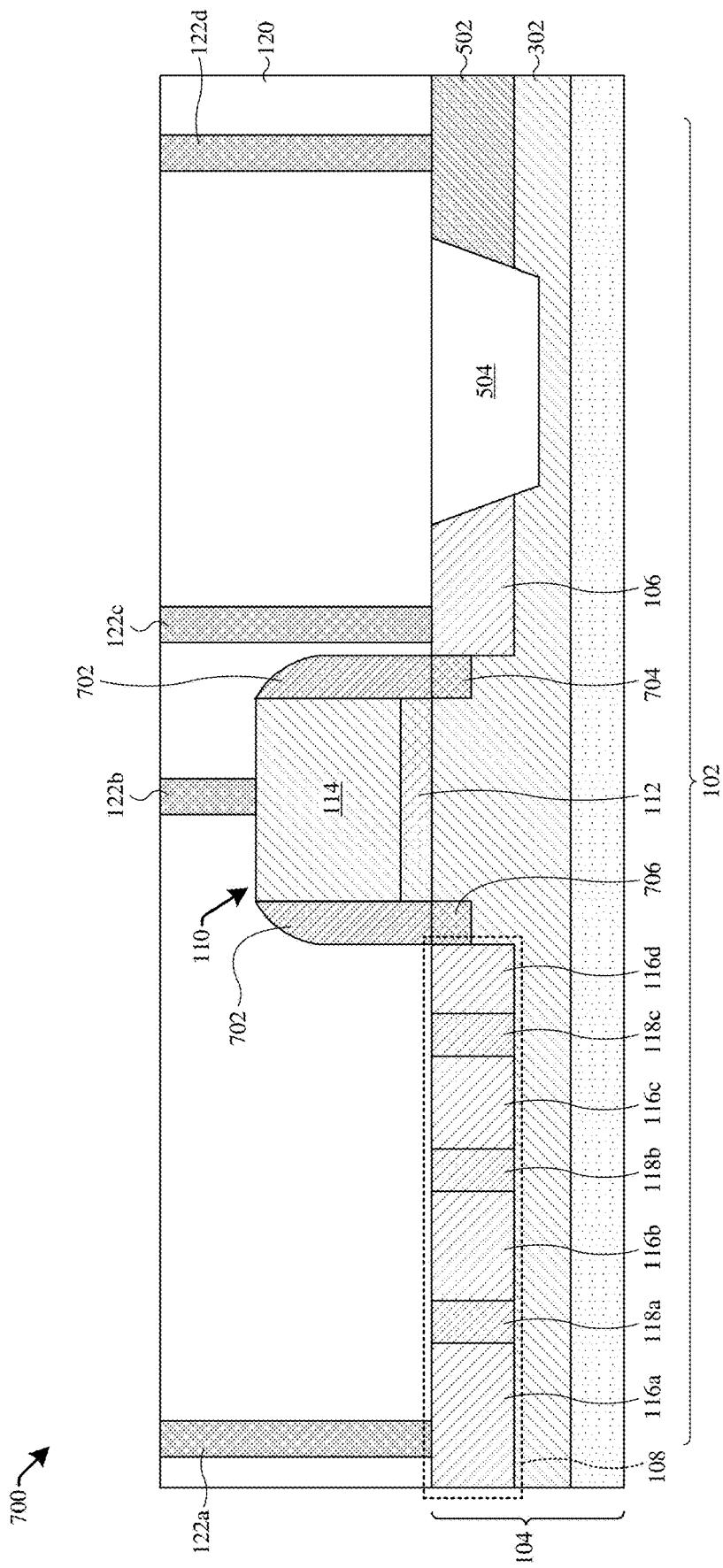
FIG. 7 illustrates a cross-sectional view of some other embodiments of the IC of FIG. 1.

FIG. 7 illustrates a cross-sectional view 700 of some other embodiments of the IC of FIG. 1.

As shown in the cross-sectional view 700 of FIG. 7, a sidewall spacer 702 is disposed over the substrate 104 and along opposite sides (e.g., sidewalls) of the gate stack 110. In some embodiments, the sidewall spacer 702 may comprise an oxide (e.g., $SiO_2$), a nitride (e.g., SiN), an oxy-nitride (e.g., SiON), a carbide (e.g., silicon carbide (SiC)), or the like.

In some embodiments, a lightly-doped source extension 704 is disposed in the substrate 104. The lightly-doped source extension 704 is a portion of the substrate 104 having the second doping type (e.g., n-type). In other words, the lightly-doped source extension 704 has the second doping type. The lightly-doped source extension 704 is disposed beneath (e.g., directly beneath) a first portion of the sidewall spacer 702, which is disposed on the same side of the gate stack 110 as the source region 106. The lightly-doped source extension 704 has a lesser concentration of the second doping type dopants than the source region 106.

In some embodiments, a side of the lightly-doped source extension 704 is substantially aligned with an inner sidewall of the first portion of the sidewall spacer 702, and a side of the source region 106 is substantially aligned with an outer sidewall of the first portion of the sidewall spacer 702. In other embodiments, the lightly-doped source extension 704 may be omitted. In such embodiments, the side of the source region 106 may be substantially aligned with the outer sidewall of the first portion of the sidewall spacer 702 or the inner sidewall of the first portion of the sidewall spacer 702. It will be appreciated that the side of the source region 106 may be disposed laterally between the inner and outer sidewalls of the first portion of the sidewall spacer 702.

In some embodiments, a lightly-doped drain extension 706 is disposed in the substrate 104. The lightly-doped drain extension 706 is a portion of the substrate 104 having the second doping type (e.g., n-type). In other words, the lightly-doped drain extension 706 has the second doping type. The lightly-doped drain extension 706 is disposed beneath (e.g., directly beneath) a second portion of the sidewall spacer 702, which is disposed on the same side of the gate stack 110 as the drain region 108. The lightly-doped drain extension 706 has a lesser concentration of the second doping type dopants than the first doped regions 116. In some embodiments, the lightly-doped drain extension 706 has a lesser or greater concentration of the second doping type dopants than the second doped regions 118. In other embodiments, the lightly-doped drain extension 706 and the second doped regions 118 have substantially the same doping concentration of the second doping type dopants.

In some embodiments, a side of the lightly-doped drain extension 706 is substantially aligned with an inner sidewall of the second portion of the sidewall spacer 702, and a side of the drain region 108 is substantially aligned with an outer sidewall of the second portion of the sidewall spacer 702. In other embodiments, the lightly-doped drain extension 706 may be omitted. In such embodiments, the side of the drain region 108 may be substantially aligned with the outer sidewall of the second portion of the sidewall spacer 702 or the inner sidewall of the second portion of the sidewall spacer 702. It will be appreciated that the side of the drain region 108 may be disposed laterally between the inner and outer sidewalls of the second portion of the sidewall spacer 702.

Figure 8A:
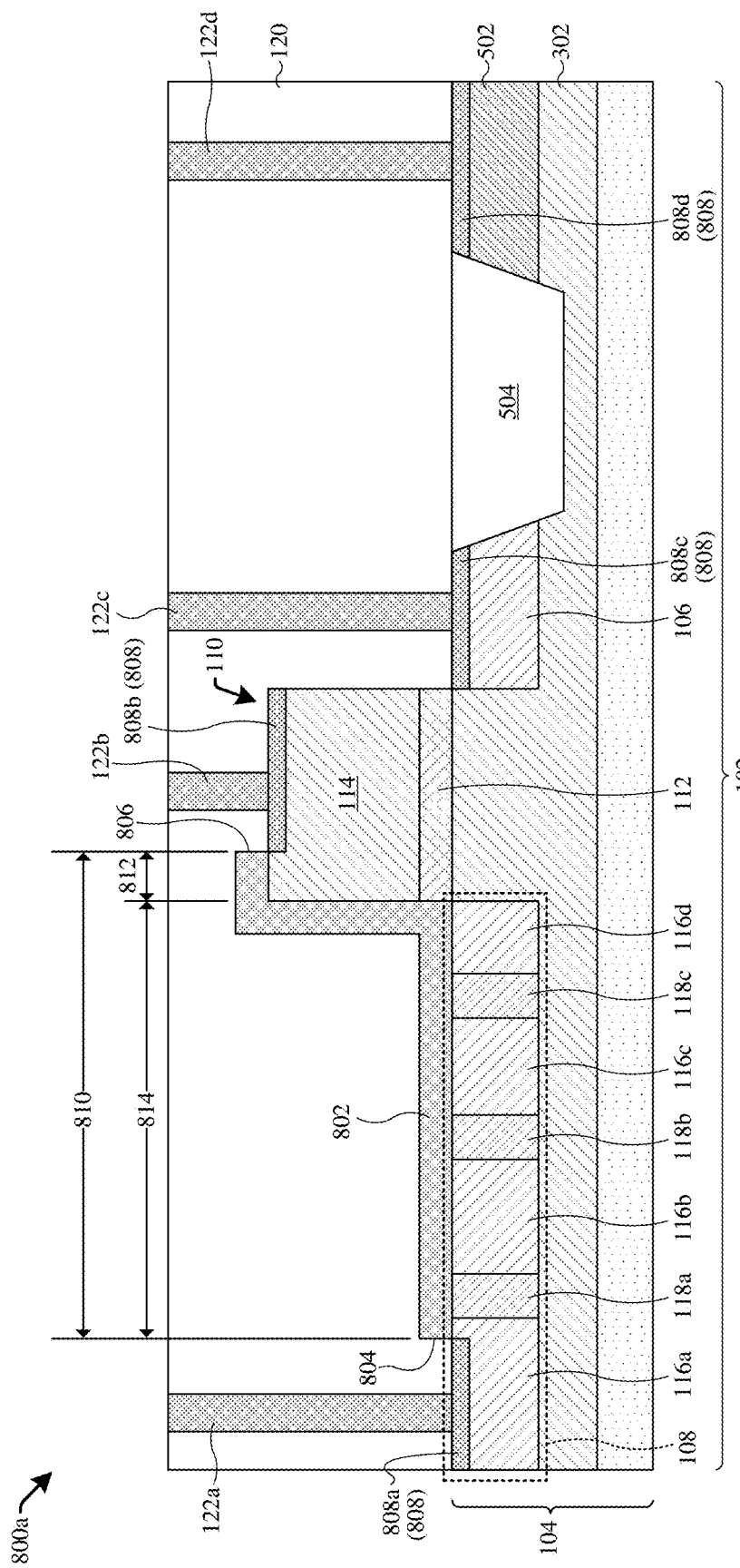
FIG. 8A-8B illustrates cross-sectionals view of some other embodiments of the IC of FIG. 1.
Figure 8B:
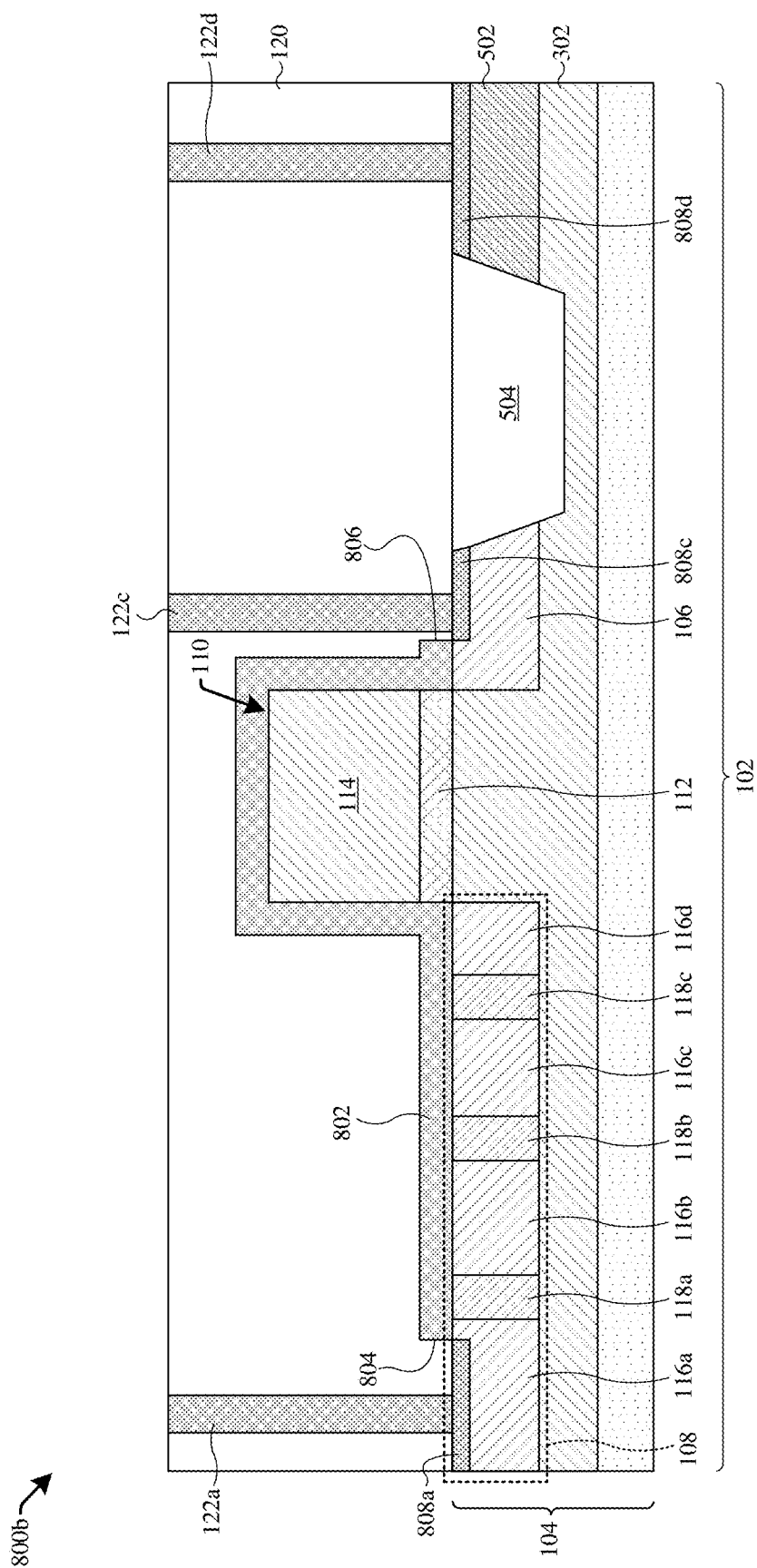

FIG. 8A-8B illustrates cross-sectional views 800a-800b of some other embodiments of the IC of FIG. 1.

As shown in the cross-sectional view 800a of FIG. 8A, a silicide blocking layer 802 (e.g., a resist protective oxide (RPO) layer) is disposed over the substrate 104. The silicide blocking layer 802 is configured to prevent the formation of silicide structures on structures of the IC that are covered by the silicide blocking layer 802. The silicide blocking layer 802 extends continuously from the gate stack 110 to cover one or more of the first doped regions 116 and one of the second doped regions 118. For example, as shown in the cross-sectional view 800a of FIG. 8A, the silicide blocking layer 802 extends continuously from the gate stack 110 to cover (e.g., completely cover) the sixth doped region 116d, the seventh doped region 118c, the third doped region 116c, the fifth doped region 118b, the second doped region 116b, and the fourth doped region 118a. In some embodiments, the silicide blocking layer 802 partially covers the first doped region 116a. In such embodiments, the silicide blocking layer 802 has a first sidewall 804 disposed between a first side of the first doped region 116a and a second side of the first doped region 116a opposite the first side of the first doped region 116a, where the first side of the first doped region 116a is disposed nearer the gate stack than the second side of the first doped region 116a. In other embodiments, the silicide blocking layer 802 does not cover the first doped region 116a. In such embodiments, the first sidewall 804 of the silicide blocking layer 802 is disposed between the first doped region 116a and the gate stack 110. In other words, the first sidewall 804 of the silicide blocking layer 802 is disposed between the first side of the first doped region 116a and the gate stack 110.

In some embodiments, the silicide blocking layer 802 extends vertically along a first side of the gate stack 110. In further embodiments, the silicide blocking layer 802 is also disposed over the gate stack 110. The silicide blocking layer 802 may partially covers an upper surface of the conductive gate electrode 114. In such embodiments, the silicide blocking layer 802 has a second sidewall 806 that is disposed between opposite sidewalls of the conductive gate electrode 114. In further such embodiments, the semiconductor device 102 may be configured to serve both a circuitry function and an ESD protection function (e.g., protect the IC from an ESD pulse).

As shown in the cross-sectional view 800b of FIG. 8B, in other embodiments, the silicide blocking layer 802 extends laterally over the upper surface of the upper surface of the conductive gate electrode 114, extends vertically along a second side of the gate stack 110 opposite the first side of the gate stack 110, and laterally over a portion of the source region 106. In such embodiments, the second sidewall 806 of the silicide blocking layer 802 and the first sidewall 804 of the silicide blocking layer 802 are disposed on opposite sides of the gate stack 110. In further such embodiments, the semiconductor device 102 may be configured to serve the ESD protection function (e.g., protect the IC from an ESD pulse) without serving the circuitry function.

A plurality of silicide structures 808 are disposed on the substrate 104 and the conductive gate electrode 114. For example, the silicide structures 808 comprise a first silicide structure 808a on the first doped region 116a, a second silicide structure 808b on the conductive gate electrode 114, a third silicide structure 808c on the source region 106, and a fourth silicide structure 808d on the pick-up region 502. The silicide structures 808 are configured to provide low resistance paths between the substrate 104 or the conductive gate electrode 114 and corresponding conductive contacts 122. For example, the first silicide structure 808a is configured to provide a low resistance path between the first doped region 116a and the first conductive contact 122a, the second silicide structure 808b is configured to provide a low resistance path between the conductive gate electrode 114 and the second conductive contact 122b, and so forth. The silicide structures 808 may comprises, for example, nickel (e.g., nickel silicide), titanium (e.g., titanium silicide), platinum (e.g., platinum silicide), tungsten (e.g., tungsten silicide), some other silicide material, or a combination of the foregoing.

In some embodiments, a side of the first silicide structure 808a is substantially aligned with the first sidewall 804 of the silicide blocking layer 802. In such embodiments, the side of the first silicide structure 808a is disposed between the first side of the first doped region 116a and the second side of the first doped region 116a. In other embodiments, the first silicide structure 808a extends continuously from the first side of the first doped region 116a to the second side of the first doped region 116a. In some embodiments, a side of the second silicide structure 808b is substantially aligned with the second sidewall 806 of the silicide blocking layer 802. In such embodiments, the side of the second silicide structure 808b is disposed between the opposite sidewalls of the conductive gate electrode 114. In other embodiments, the second silicide structure 808b may extend laterally between the first portion and the second portion of the sidewall spacer 702.

The silicide blocking layer 802 further improves the ESD protection of the semiconductor device 102. For example, because the silicide blocking layer 802 is configured to prevent the formation of the silicide structures 808 on structures of the IC that are covered by the silicide blocking layer 802, the silicide blocking layer 802 causes the resistance of a portion of the drain region 108 covered by the silicide blocking layer 802 and a portion of the conductive gate electrode 114 covered by the silicide blocking layer 802 to be relatively high compared to other portions of the drain region 108 and the conductive gate electrode 114 having silicide structures 808 disposed thereon. Thus, if an ESD pulse propagates through the IC to the semiconductor device 102, thereby causing a voltage spike on the first doped region 116a, the ESD pulse will be driven down into the substrate 104. Because the ESD pulse is driven down into the substrate 104, the ESD pulse is moved away from the gate dielectric 112, thereby preventing ESD damage to the semiconductor device 102 (e.g., "blow out" of the gate dielectric 112).

The silicide blocking layer 802 has a tenth width 810. In some embodiments, the tenth width 810 is an overall width of the silicide blocking layer 802 (e.g., a distance between the first sidewall 804 of the silicide blocking layer 802 and the second sidewall 806 of the silicide blocking layer 802). In some embodiments, the tenth width 810 is between about 1.6 um and about 2 um. More specifically, in some embodiments, the tenth width 810 is about 1.95 um. The silicide blocking layer 802 overlaps the conductive gate electrode 114 by a first distance 812. In some embodiments, the first distance 812 is less than or equal to about 0.06 um. More specifically, in some embodiments, the first distance 812 is 0.06 um. The silicide blocking layer 802 extends from the gate stack 110 a second distance 814. The second distance 814 is equal to the tenth width 810 minus the first distance 812. In some embodiments, if the tenth width 810 is greater than about 2 um, the semiconductor device 102 may not be able to output a strong enough electrical signal (e.g., voltage). In further embodiments, if the tenth width 810 is less than about 1.6 um, the semiconductor device 102 may have poor ESD protection.

Figure 9:
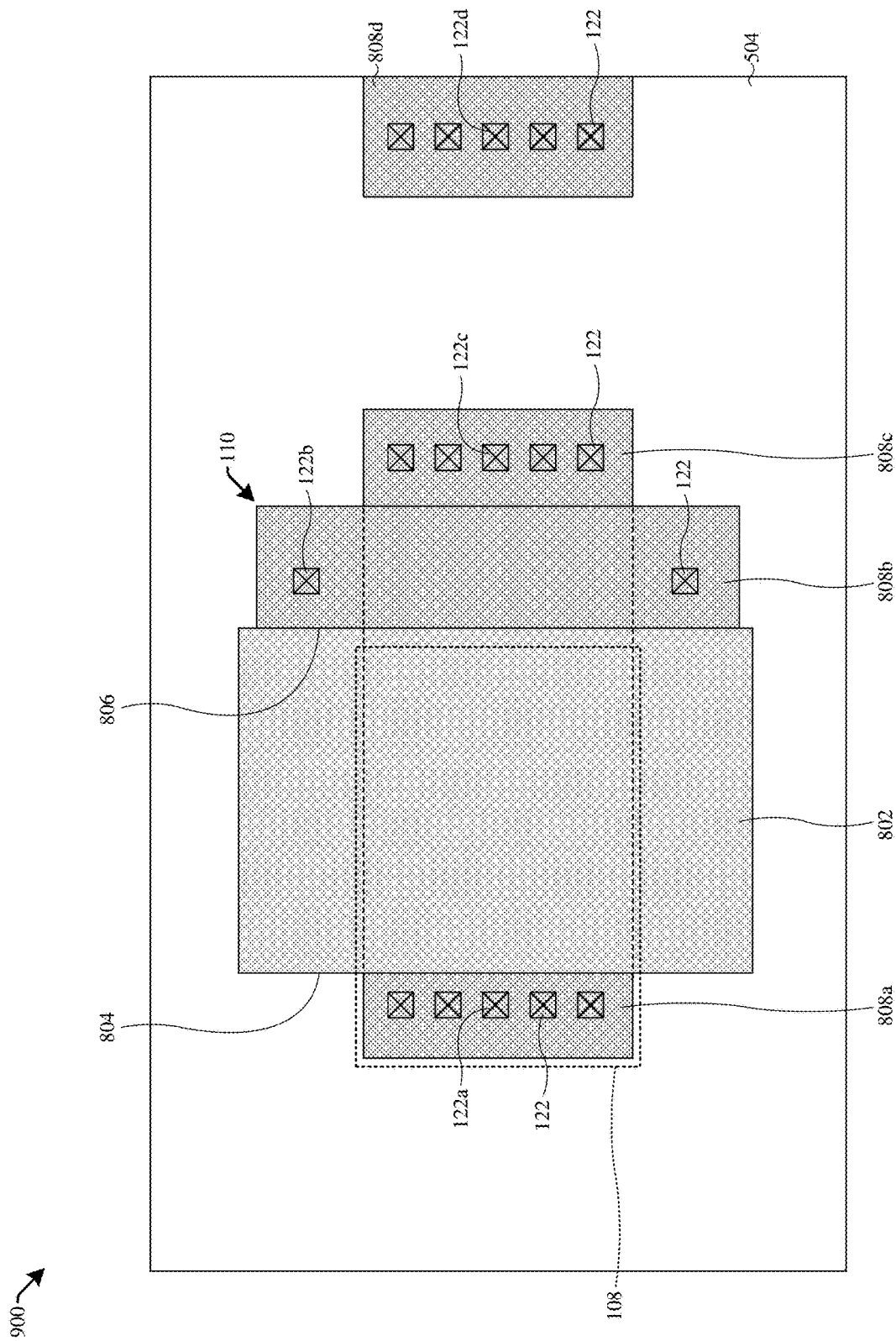
FIG. 9 illustrates a simplified top view of some embodiments of the IC of FIG. 8A.

FIG. 9 illustrates a simplified top view 900 of some embodiments of the IC of FIG. 8A. The simplified top view 900 of FIG. 9 is "simplified" because the simplified top view 900 of FIG. 9 does not illustrate the ILD structure 120 and because each of the conductive contacts 122 are illustrated as an "X" confined within a box.

As shown in the simplified top view 900 of FIG. 9, the isolation structure 504 laterally surrounds the source region 106, the gate stack 110, and the drain region 108 (see, e.g., FIG. 8A). As such, a first portion of the isolation structure 504 is disposed between the source region 106 and the pick-up region 502, a second portion of the isolation structure 504 is disposed on an opposite side of the drain region 108 as the first portion of the isolation structure 504, a third portion of the isolation structure 504 extends laterally from the first portion of the isolation structure 504 to the second portion of the isolation structure 504, and a fourth portion of the isolation structure 504, which is opposite the third portion of the isolation structure 504, also extends laterally from the first portion of the isolation structure 504 to the second portion of the isolation structure 504.

In some embodiments, the silicide blocking layer 802 may continuously extend over the drain region 108, such that the silicide blocking layer 802 partially covers the third portion of the isolation structure 504 and/or the fourth portion of the isolation structure 504. In other words, the silicide blocking layer 802 may overlie a segment of the third portion of the isolation structure 504 and/or a segment of the fourth portion of the isolation structure 504. For example, as shown in the simplified top view 900 of FIG. 9, the silicide blocking layer 802 partially covers the third portion of the isolation structure 504 and the fourth portion of the isolation structure 504 (e.g., the dotted lines extending laterally through the gate stack 110 and the silicide blocking layer 802 illustrate edges of the isolation structure 504).

Figure 10:
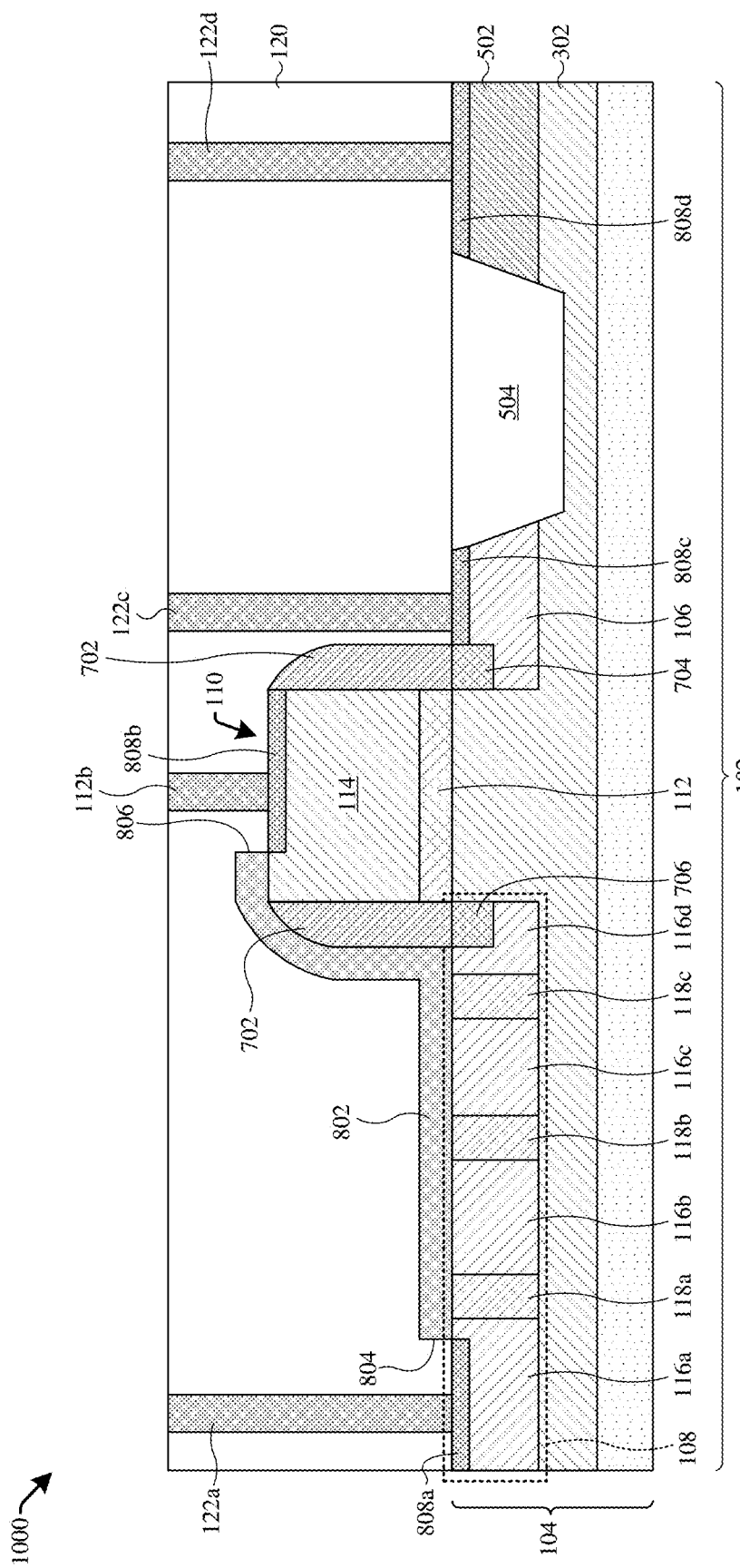
FIG. 10 illustrates a cross-sectional view of some other embodiments of the IC of FIG. 1.

FIG. 10 illustrates a cross-sectional view 1000 of some other embodiments of the IC of FIG. 1.

As shown in cross-sectional view 1000 of FIG. 10, the silicide blocking layer 802 is disposed along the sidewall spacer 702. More specifically, the silicide blocking layer 802 is disposed along the second portion of the sidewall spacer 702. In such embodiments, the silicide blocking layer 802 covers the second portion of the sidewall spacer 702 and extends laterally over the upper surface of the conductive gate electrode 114 to partially cover the upper surface of the conductive gate electrode 114. In such embodiments, a portion of an outer sidewall of the silicide blocking layer 802 may be rounded.

Figure 11:
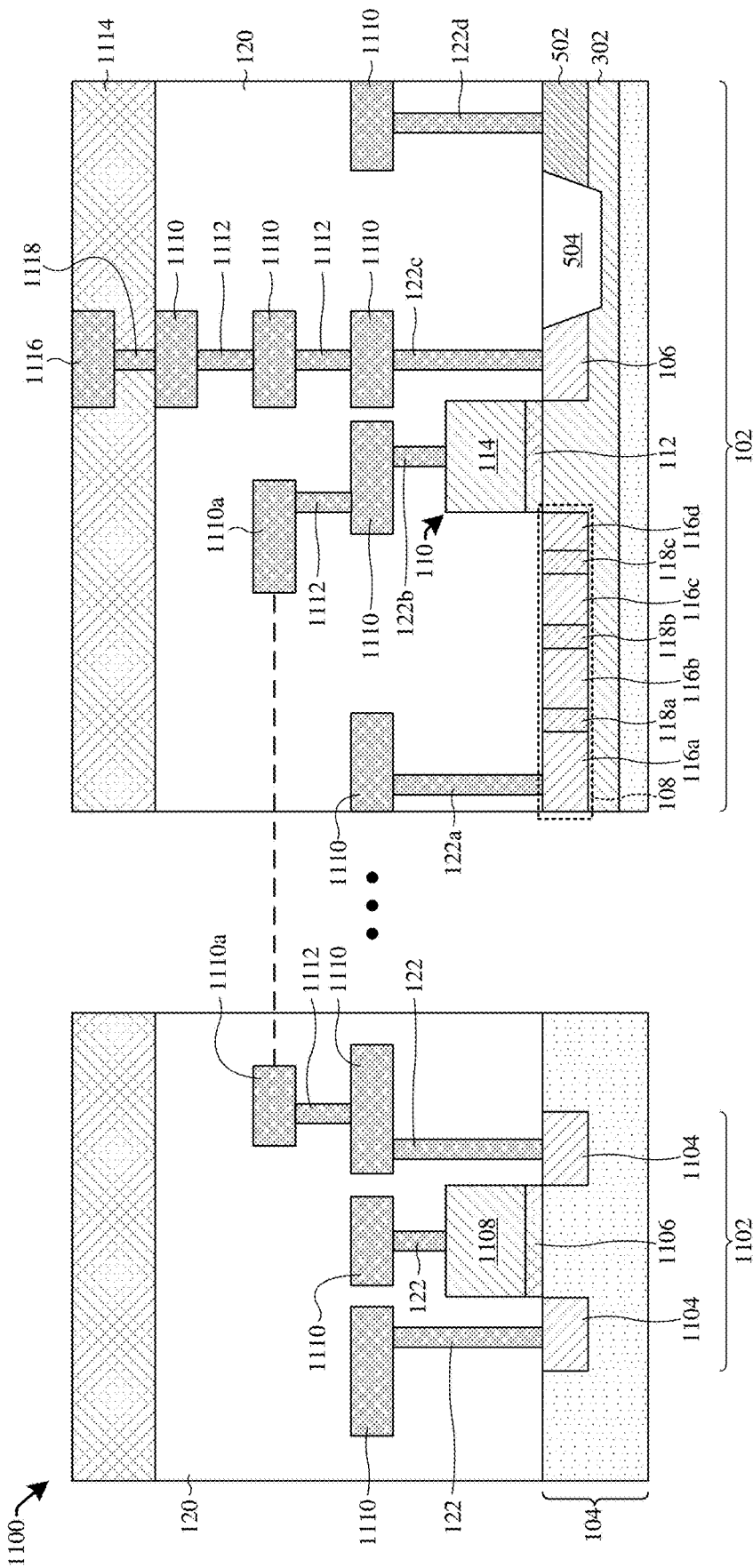
FIG. 11 illustrates a cross-sectional view of some other embodiments of the IC of FIG. 1.

FIG. 11 illustrates a cross-sectional view 1100 of some other embodiments of the IC of FIG. 1.

As shown in cross-sectional view 1100 of FIG. 11, the IC comprises one or more logic devices 1102 (e.g., a MOSFET). The logic devices 1102 comprise a pair of source/drain regions 1104 that are laterally spaced and in the substrate 104. A gate dielectric 1106 is over the substrate 104 and between the source/drain regions 1104. A gate electrode 1108 overlies the gate dielectric 1106.

A plurality of conductive wires 1110 (e.g., metal wires) and a plurality of conductive vias 1112 (e.g., metal vias) are stacked in the ILD structure 120. The conductive wires 1110, the conductive vias 1112, and the conductive contacts 122 may be collectively referred to as an interconnect structure (e.g., metal interconnect). A passivation layer 1114 is disposed over the ILD structure 120. One or more input/output (I/O) structures 1116 (e.g., bond pads, solder bumps, etc.) are disposed in the passivation layer 1114 and over the ILD structure 120. One or more upper conductive vias 1118 are disposed in the passivation layer 1114 and electrically couple the I/O structures 1116 to the interconnect structure. In some embodiments, the conductive wires 1110 and the conductive vias 1112 are or comprise, for example, copper (Cu), aluminum (Al), aluminum copper (AlCu), tungsten (W), some other conductive material, or a combination of the foregoing. The I/O structures 1116 and the upper conductive vias 1118 are or comprise, for example, copper (Cu), aluminum (Al), aluminum copper (AlCu), tungsten (W), gold (Au), silver (Ag), lead (Pb), tin (Sn), zinc (Zn), antimony (Sb), some other conductive material, or a combination of the foregoing.

The interconnect structure is configured to electrically coupled various features (e.g., structural features) of the IC together in a predefined manner. For example, the conductive wires 1110 comprise a first conductive wire 1110a. The first conductive wire 1110a is electrically coupled to one of the source/drain regions 1104 of one of the logic devices 1102 via a conductive contact of the conductive contacts 122, one or more conductive vias 1112, and one or more other conductive wires 1110. The first conductive wire 1110a extends through the ILD structure 120 (e.g., illustrated by the dotted line in FIG. 11) and is also electrically coupled to the conductive gate electrode 114 of the semiconductor device 102 via one or more other conductive vias 1112, one or more other conductive wires 1110, and the second conductive contact 122b. As such, the conductive wires 1110, the conductive vias 1112, and the conductive contacts 122 define a first conductive path leading from the one of the source/drain regions 1104 of the one of the logic devices 1102 to the conductive gate electrode 114 of the semiconductor device 102. Further, a second conductive path leads from the source region 106 of the semiconductor device 102 to one of the I/O structures 1116. In some embodiments, a third conductive path leads from the drain region 108 of the semiconductor device 102 that electrically couples the drain region 108 to ground (e.g., 0 V).

In such embodiments, the I/O structures 1116 may be configured as open-drain I/O structures (e.g., open-drain output pads). In further such embodiments, the semiconductor device 102 may be part of an open-drain buffer circuit of the IC. Because the semiconductor device 102 comprises the drain region 108, the semiconductor device 102 has improved ESD protection. Therefore, the open-drain buffer circuit also has improved ESD protection. Thus, the IC may have I/O structures 1116 in an open-drain configuration (e.g., open-drain output pads) while providing good ESD protection (e.g., the semiconductor device 102 can withstand an ESD pulse having a voltage greater than or equal to about 2,000 V).

Figure 12:
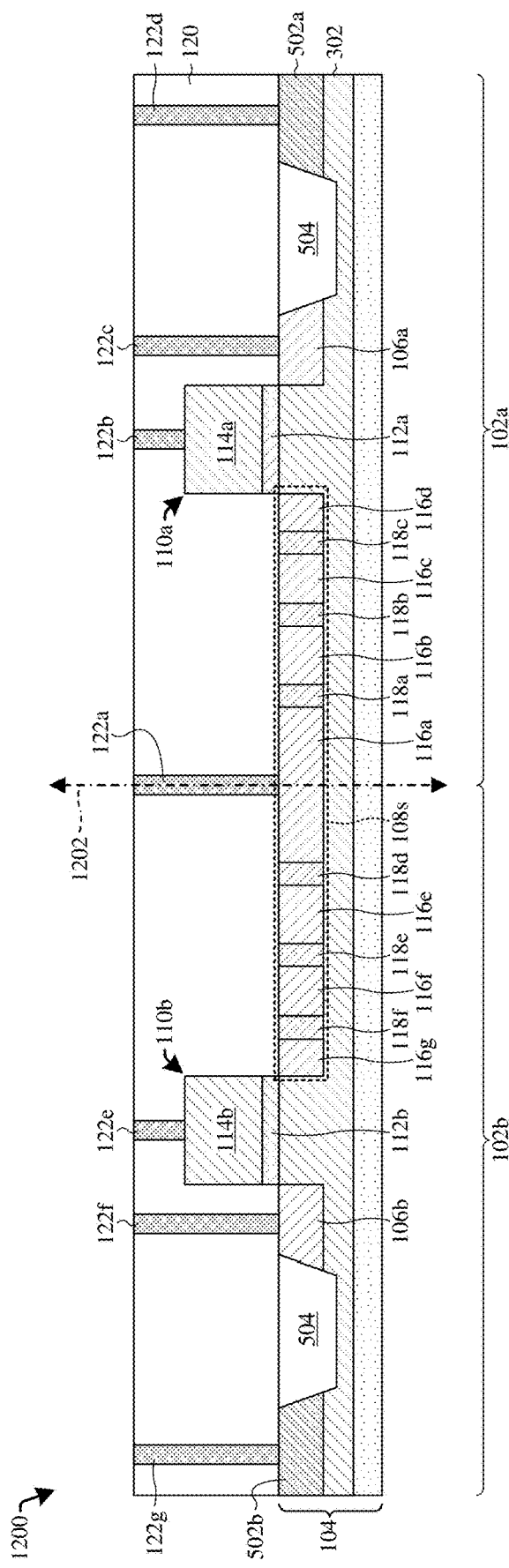
FIG. 12 illustrates a cross-sectional view of some other embodiments of the IC of FIG. 1.

FIG. 12 illustrates a cross-sectional view 1200 of some other embodiments of the IC of FIG. 1.

As shown in cross-sectional view 1200 of FIG. 12, the IC comprises a first semiconductor device 102a and second semiconductor device 102b. The first semiconductor device 102a comprises a first gate stack 110a, a first source region 106a, and a first pick-up region 502a. The first gate stack 110a comprises a first conductive gate electrode 114a overlying a first gate dielectric 112a. The second semiconductor device 102b comprises a second gate stack 110b, a second source region 106b, and a second pick-up region 502b. In some embodiments, the second pick-up region 502b or the first pick-up region 502a is omitted. The second gate stack 110b comprises a second conductive gate electrode 114b overlying a second gate dielectric 112b. In some embodiments, the conductive contacts 122 comprise a fifth conductive contact 122e, a sixth conductive contact 122f, and a seventh conductive contact 122g. The fifth conductive contact 122e is electrically coupled to the second conductive gate electrode 114b, the sixth conductive contact 122f is electrically coupled to the second source region 106b, and the seventh conductive contact 122g is electrically coupled to the second pick-up region 502b.

The first semiconductor device 102a and the second semiconductor device 102b share a shared drain region 108s. In some embodiments, the shared drain region 108s comprises the first doped region 116a, the second doped region 116b, the third doped region 116c, the sixth doped region 116d, an eighth doped region 116e, a ninth doped region 116f, a tenth doped region 116g, the fourth doped region 118a, the fifth doped region 118b, the seventh doped region 118c, an eleventh doped region 118d, a twelfth doped region 118e, and a thirteenth doped region 118f. In such embodiments, the first doped regions 116 comprise the first doped region 116a, the second doped region 116b, the third doped region 116c, the sixth doped region 116d, the eighth doped region 116e, the ninth doped region 116f, and the tenth doped region 116g, and the second doped regions 118 comprise the fourth doped region 118a, the fifth doped region 118b, the seventh doped region 118c, the eleventh doped region 118d, the twelfth doped region 118e, and the thirteenth doped region 118f.

As shown in the cross-sectional view 1200 of FIG. 12, the first semiconductor device 102a may, for example, be configured as the semiconductor device 102 of FIG. 5. However, it will be appreciated that the first semiconductor device 102a may be configured as the semiconductor device 102 of FIGS. 1-11 or some other semiconductor device 102 that has improved ESD protection. In some embodiments, the second semiconductor device 102b is a mirror image of the first semiconductor device 102a across a line of symmetry 1202. As such, the second semiconductor device 102b may, for example, also be configured as the semiconductor device 102 of FIG. 5, but in a mirrored configuration, as shown in the cross-sectional view 1200 of FIG. 12. It will be appreciated that the second semiconductor device 102b may be configured as the semiconductor device 102 of FIGS. 1-11 or some other semiconductor device 102 that has improved ESD protection, but in a mirrored configuration.

Figure 13:
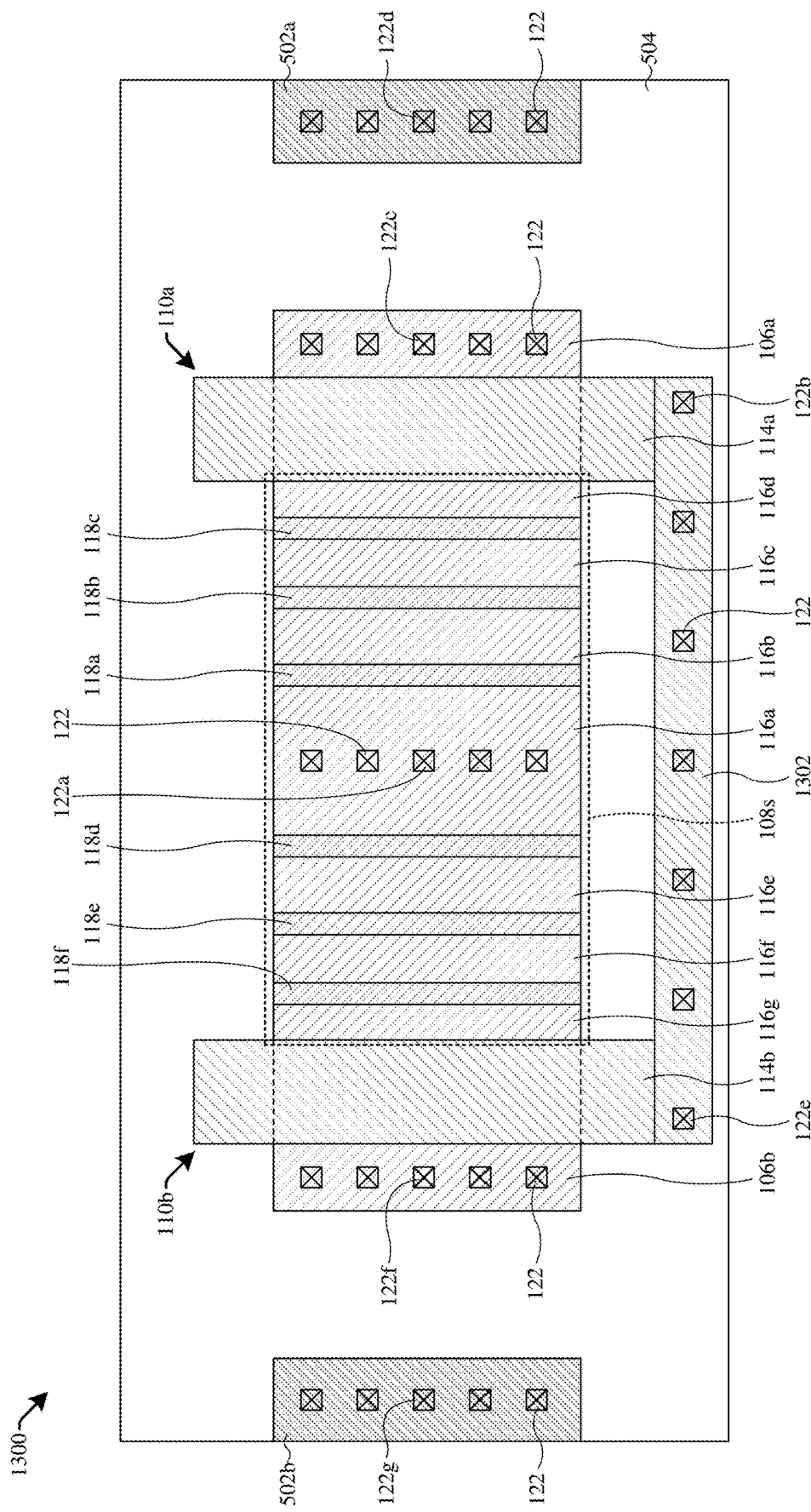
FIG. 13 illustrates a simplified top view of some embodiments of the IC of FIG. 12.

FIG. 13 illustrates a simplified top view 1300 of some embodiments of the IC of FIG. 12. The simplified top view 1300 of FIG. 13 is "simplified" because the simplified top view 1300 of FIG. 13 does not illustrate the ILD structure 120 and because each of the conductive contacts 122 are illustrated as an "X" confined within a box.

As shown in the simplified top view 1300 of FIG. 13, the isolation structure 504 laterally surrounds the first source region 106a, the first gate stack 110a, the shared drain region 108s, the second source region 106b, and the second gate stack 110b. As such, a first portion of the isolation structure 504 is disposed between the first source region 106a and the first pick-up region 504a, a second portion of the isolation structure 504 is disposed on an opposite side of the shared drain region 108s as the first portion of the isolation structure 504 and between the second source region 106b and the second pick-up region 502b, a third portion of the isolation structure 504 extends laterally from the first portion of the isolation structure 504 to the second portion of the isolation structure 504, and a fourth portion of the isolation structure 504, which is opposite the third portion of the isolation structure 504, also extends laterally from the first portion of the isolation structure 504 to the second portion of the isolation structure 504. In some embodiments, the first gate stack 110a and the second gate stack 110b may partially cover the third portion of the isolation structure 504 and/or the fourth portion of the isolation structure 504. In other words, the first gate stack 110a and the second gate stack 110b may overlie a segment of the third portion of the isolation structure 504 and/or a segment of the fourth portion of the isolation structure 504. For example, as shown in the simplified top view 1300 of FIG. 13, both the first gate stack 110a and the second gate stack 110b partially cover the third portion of the isolation structure 504 and the fourth portion of the isolation structure 504 (e.g., the dotted lines extending laterally through the first gate stack 110a and the second gate stack 110b illustrate edges of the isolation structure 504). In other embodiments, the first gate stack 110a and/or the second gate stack 110b may not overlie the isolation structure 504.

Also shown in the simplified top view 1300 of FIG. 13, one or more conductive gate extension structures 1302 are disposed over (e.g., directly over) the isolation structure 504. The conductive gate extension structure 1302 is electrically coupled to the first conductive gate electrode 114a and the second conductive gate electrode 114b. In such embodiments, the conductive contacts 122 that are electrically coupled to the first conductive gate electrode 114a and the second conductive gate electrode 114b are electrically coupled to and extend vertically from the conductive gate extension structure 1302. For example, the second conductive contact 122b and the fifth conductive contact 122e are electrically coupled to and extend vertically from the conductive gate extension structure 1302, and thus the second conductive contact 122b and the fifth conductive contact 122e are electrically coupled to the first conductive gate electrode 114a and the second conductive gate electrode 114b.

The conductive gate extension structure 1302 may be or comprise a same conductive material as the first conductive gate electrode 114a and/or the second conductive gate electrode 114b. In other embodiments, the conductive gate extension structure 1302 may be or comprise a different conductive material than the first conductive gate electrode 114a and/or the second conductive gate electrode 114b. The conductive gate extension structure 1302 extends laterally in a direction that is perpendicular to a direction in which the first gate stack 110a and the second gate stack 110b laterally extend. The conductive gate extension structure 1302 is disposed outside an inner perimeter of the isolation structure 504 in which the first source region 106a, the second source region 106b, and the shared drain region 108s are disposed within.

Also shown in the simplified top view 1300 of FIG. 13, additional conductive contacts 122 may be electrically coupled to the substrate 104, the first gate stack 110a, or the second gate stack 110b. For example, as shown in the simplified top view 1300 of FIG. 13, five (5) individual conductive contacts 122 are electrically coupled to the shared drain region 108s, seven (7) individual conductive contacts 122 are electrically coupled to the conductive gate extension structure 1302 (and thus the first conductive gate electrode 114a and the second conductive gate electrode 114b), five (5) individual conductive contacts 122 are electrically coupled to the first source region 106a, five (5) individual conductive contacts 122 are electrically coupled to the first pick-up region 502a, five (5) individual conductive contacts 122 are electrically coupled to the second source region 106b, and five (5) individual conductive contacts 122 are electrically coupled to the second pick-up region 502b. It will be appreciated that any number of individual may be electrically coupled to the substrate 104, the first gate stack 110a, or the second gate stack 110b.

Also shown in the simplified top view 1300 of FIG. 13, in some embodiments, none of the conductive contacts 122 are electrically coupled to the second doped region 116b, the third doped region 116c, the sixth doped region 116d, the eighth doped region 116e, the ninth doped region 116f, the tenth doped region 116g, or any of the second doped regions 118. Rather, the only conductive contacts 122 that are electrically coupled to the shared drain region 108s are electrically coupled to the one of the first doped regions 116 that is spaced the furthest from both the first gate stack 110a and the second gate stack 110b. For example, as shown in the simplified top view 1300 of FIG. 13, the only conductive contacts 122 that are electrically coupled to the shared drain region 108s are electrically coupled to the first doped region 116a. In such embodiments, the ILD structure 120 (see, e.g., FIG. 5) completely covers the second doped region 116b, the third doped region 116c, the sixth doped region 116d, the eighth doped region 116e, the ninth doped region 116f, the tenth doped region 116g, and each of the second doped regions 118.

FIGS. 14-23 illustrates a series of cross-sectionals views 1400-2300 of some embodiments of a method for forming an integrated chip (IC) comprising a semiconductor device 102 that has improved ESD performance. Although FIGS. 14-23 are described with reference to a method, it will be appreciated that the structures shown in FIGS. 14-23 are not limited to the method but rather may stand alone separate of the method.

As shown in cross-sectional view 1400 of FIG. 14, a well region 302 is formed in a substrate 104. The well region 302 is a region of the substrate 104 having a first doping type (e.g. p-type doping). In some embodiments, the well region 302 may be formed by a doping process (e.g., ion implantation process) and may utilize a patterned masking layer (not shown) (e.g., positive/negative photoresist, a hardmask, etc.) to selectively implant first doping type dopant species (e.g., p-type dopants, such as boron (B), aluminum (Al), gallium (Ga), or the like) into the substrate 104. In other embodiments, the doping process may be a blanket doping process. The patterned masking layer may be formed by forming a masking layer (not shown) on the substrate 104 (e.g., via a spin-on process), exposing the masking layer to a pattern (e.g., via a lithography process, such as photolithography, extreme ultraviolet lithography, or the like), and developing the masking layer to form the patterned masking layer. In some embodiments, the patterned masking layer may be stripped away.

As shown in cross-sectional view 1500 of FIG. 15, an isolation structure 504 is formed in the substrate 104. In some embodiments, the isolation structure 504 is formed in the well region 302. In further embodiments, the isolation structure 504 may be formed by selectively etching the substrate 104 to form a trench in the substrate 104, and subsequently filing the trench with a dielectric material.

The substrate 104 is selectively etched by forming a patterned masking layer (not shown) (e.g., positive/negative photoresist, a hardmask, etc.) over the substrate 104. Thereafter, with the patterned masking layer in place, an etching process is performed on the substrate 104 according to the patterned masking layer. The etching process removes unmasked portions of the substrate 104, thereby forming the trench in the substrate 104. In some embodiments, the etching process may be, for example, a wet etching process, a dry etching process, a reactive ion etching (RIE) process, some other etching process, or a combination of the foregoing. In some embodiments, the patterned masking layer may be stripped away.

Thereafter, the trench is filled with the dielectric material. The dielectric material may be or comprise, for example, an oxide (e.g., SiO$_2$), a nitride (e.g., silicon nitride (SiN)), an oxy-nitride (e.g., silicon oxy-nitride (SiON)), a carbide (e.g., silicon carbide (SiC)), some other dielectric material, or a combination of the foreign. In some embodiments, a process for filing the trench with the dielectric material comprises depositing or growing the dielectric material on the substrate 104 and in the trench. The dielectric material may be deposited or grown by, for example, chemical vapor deposition (CVD), physical vapor deposition (PVD), atomic layer deposition (ALD), thermal oxidation, some other deposition or growth process, or a combination of the foregoing. In some embodiments, a planarization process (e.g., a chemical-mechanical polishing (CMP)) may be performed on the dielectric material to remove an upper portion of the dielectric material, thereby leaving a lower portion of the dielectric material in the trenches as the isolation structure 504.

As shown in cross-sectional view 1600 of FIG. 16, a pick-up region 502 is formed in the substrate 104. The pick-up region 502 is a region of the substrate 104 having the first doping type (e.g., p-type). The pick-up region 502 has a greater concentration of the first doping type dopants than the well region 302 (or the substrate 104). In some embodiments, the well region 302 may be formed by a doping process (e.g., ion implantation process) and may utilize a patterned masking layer (not shown) to selectively implant additional first doping type dopant species into the well region 302 (or the substrate 104). In some embodiments, the patterned masking layer may be stripped away.

As shown in cross-sectional view 1700 of FIG. 17, a gate stack 110 is formed over the substrate 104. The gate stack 110 comprises a gate dielectric 112 over the substrate 104, and a conductive gate electrode 114 overlying the gate dielectric 112. In some embodiments, a process for forming the gate stack 110 comprises depositing or growing a gate dielectric layer (not shown) on the substrate 104. The gate dielectric layer may be or comprise, for example, an oxide (e.g., silicon dioxide (SiO$_2$)), a nitride (e.g., silicon nitride (SiN)), a high-k dielectric material (e.g., hafnium oxide (HfO), tantalum oxide (TaO), hafnium silicon oxide (Hf-SiO), hafnium tantalum oxide (HMO), aluminum oxide (AlO), zirconium oxide (ZrO), or the like), some other dielectric material, or a combination of the foregoing. The gate dielectric layer may be deposited or grown by, for example, CVD, PVD, ALD, thermal oxidation, some other deposition or growth process, or a combination of the foregoing.

Thereafter, a conductive gate electrode layer (not shown) is deposited on the gate dielectric layer. The conductive gate electrode layer may be or comprise, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing. The conductive gate electrode layer may be deposited by, for example, CVD, PVD, ALD, sputtering, electrochemical plating, electroless plating, or the like. A patterned masking layer (not shown) is then formed on the conductive gate electrode layer. With the patterned masking layer in place, an etching process is performed on the conductive gate electrode layer and the gate dielectric layer according to the patterned masking layer. The etching process removes unmasked portions of the gate dielectric layer and the conductive gate electrode layer, thereby forming the gate dielectric 112 and the conductive gate electrode 114, respectively. In some embodiments, the etching process may be, for example, a wet etching process, a dry etching process, a RIE process, some other etching process, or a combination of the foregoing. In further embodiments, the patterned masking layer may be stripped away.

As shown in cross-sectional view 1800 of FIG. 18, a patterned masking layer 1802 is formed over the substrate 104. The patterned masking layer 1802 comprises a plurality of openings 1804 that expose portions of the substrate 104. For example, as shown in the cross-sectional view 1800 of FIG. 18, four (4) individual openings of the plurality of openings 1804 are disposed on a side of the gate stack 110. In some embodiments, a process for forming the patterned masking layer 1802 comprises depositing a masking layer (e.g., negative/positive photoresist material, one or more hardmask layers, etc.) over the substrate 104, the gate stack 110, and the isolation structure 504. The masking layer may be deposited by, for example, CVD, PVD, ALD, a pin-on process, some other deposition process, or a combination of the foregoing. The masking layer is then exposed to a pattern (e.g., via a lithography process, such as photolithography, extreme ultraviolet lithography, or the like). Thereafter, the masking layer is developed to remove portions of the masking layer that were exposed (or not exposed) to the pattern, thereby forming the patterned masking layer 1802.

As shown in cross-sectional view 1900 of FIG. 19, a drain region 108 and a source region 106 are formed in the substrate 104 and on opposite sides of the gate stack 110. In some embodiments, the drain region 108 and the source region 106 are formed in the well region 302. The drain region 108 comprises two or more first doped regions 116 and one or more second doped regions 118 of the substrate 104. For example, the first doped regions 116 comprise a first doped region 116a, a second doped region 116b, a third doped region 116c, and a sixth doped region 116d, and the second doped regions 118 comprise a fourth doped region 118a, a fifth doped region 118b, and a seventh doped region 118c of the substrate 104.

The first doped regions 116 correspond to doped regions of the substrate 104 having a second doping type (e.g., n-type). The second doped regions 118 correspond to other doped regions of the substrate 104 having either the second doping type or the first doping type. For example, as shown in the cross-sectional view 1900 of FIG. 19, the fourth doped region 118a, the fifth doped region 118b, and the seventh doped region 118c have the second doping type. The first doped regions 116 have a greater concentration of second doping type dopants (e.g., n-type dopants, such as phosphorus (P), arsenic (As), antimony (Sb), or the like) than the second doped regions 118. For example, the first doped regions 116 have a first concentration of the second doping type dopants, and the second doped regions 118 have a second concentration of the second doping type dopants that is less than the first doping concertation of the second doping type dopants.

The source region 106 corresponds to a doped region of the substrate 104 having the second doping type. In some embodiments, the source region 106 corresponds to a single doped region of the substrate 104. In further embodiments, the single doped region of the substrate 104 that corresponds to the source region 106 has a doping concentration of the second doping type dopants that is substantially the same from a first side of the source region 106 to a second side of the source region 106 opposite the first side of the source region 106. In yet further embodiments, the doping concentration of the second doping type dopants of the source region 106 and the first doped regions 116 may be substantially the same. In other embodiments, the doping concentration of the second doping type dopants of the source region 106 may be greater than or less than the doping concentration of the second doping type dopants of the first doped regions 116.

In some embodiments, a process for forming the drain region 108 and the source region 106 comprises selectively doping the substrate 104 with second doping type dopant species (e.g., n-type dopants, such as phosphorus (P), arsenic (As), antimony (Sb), or the like). The substrate 104 is selectively doped with the second doping type dopant species by performing a doping process (e.g., ion implantation) on the substrate 104 with the patterned masking layer 1802 in place. Because the gate stack 110 and the patterned masking layer 1802 are in place over the substrate 104 during the doping process, the doping process selectively implants the second doping type dopant species through the openings 1804 and into the substrate 104. In some embodiments, the doping process causes the second doping type dopant species to diffuse laterally through the substrate 104, such that the second doped regions 118 have the second doping type but with a lower concertation of the second doping type dopants than the first doped regions 116. In other embodiments, the doping process is such that the second doping type dopant species do not substantially diffuse into the adjoining regions of the substrate 104. In such embodiments, the second doped regions 118 may be regions of the well region 302 (or the substrate 104) disposed directly between the first doped regions 116. In further embodiments, the patterned masking layer 1802 is subsequently stripped away.

It will be appreciated that, in some embodiments, a sidewall spacer 702 (see, e.g., FIG. 7) is formed along sides of the gate stack 110 before the drain region 108 and the source region 106 are formed. The sidewall spacer 702 may be formed by depositing a spacer layer over the substrate 104 and the gate stack 110, and then etching away horizontal portions of the spacer layer, thereby leaving vertical portions along the sides of the gate stack 110 as the sidewall spacer 702. It will further be appreciated that, in some embodiments, a lightly-doped source extension 704 and a lightly-doped drain extension 706 (see, e.g., FIG. 7) may be formed in the substrate 104 before the sidewall spacer 702 is formed. The lightly-doped source extension 704 and the lightly-doped drain extension 706 may be formed by a doping process (e.g., ion implantation) that selectively dopes the substrate 104 with the second doping type dopant species.

Figure 20:
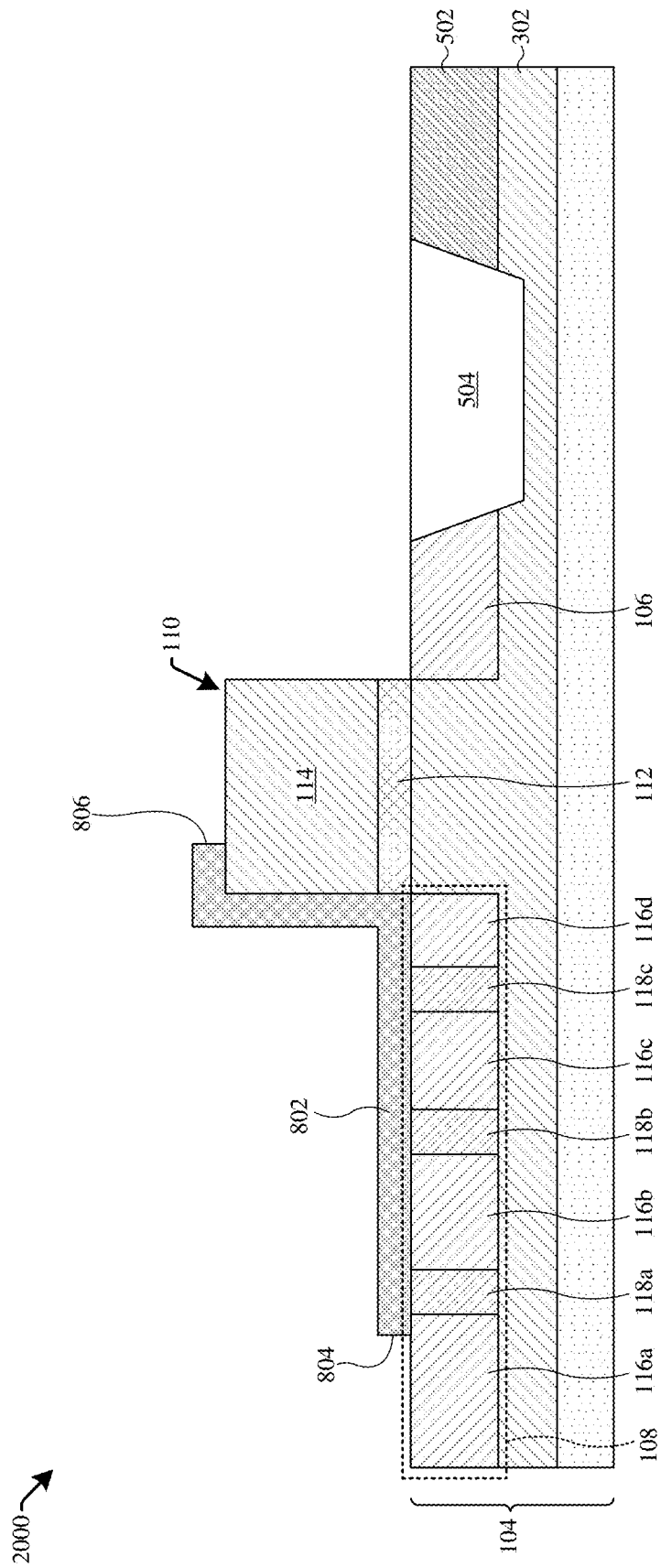

As shown in cross-sectional view 2000 of FIG. 20, a silicide blocking layer 802 is formed over the substrate 104 and the gate stack 110. The silicide blocking layer 802 partially covers the drain region 108 and partially covers the gate stack 110. In some embodiments, the silicide blocking layer 802 has a first sidewall 804 disposed between opposite sides of the first doped region 116*a*. In further embodiments, the silicide blocking layer 802 has a second sidewall 806 disposed between opposite sidewalls of the conductive gate electrode 114.

In some embodiments, a process for forming the silicide blocking layer 802 comprises depositing or growing a silicide blocking material (not shown) (e.g., a resist protective oxide (RPO) material) over the substrate 104 and the gate stack 110. The silicide blocking material may be deposited or grown by, for example, CVD, PVD, ALD, thermal oxidation, some other deposition or growth process, or a combination of the foregoing. A patterned masking layer (not shown) is then formed on the silicide blocking material. With the patterned masking layer in place, an etching process is performed on the silicide blocking material. The etching process removes unmasked portions of the silicide blocking material, thereby forming the silicide blocking layer 802. In some embodiments, the etching process may be, for example, a wet etching process, a dry etching process, a RIE process, some other etching process, or a combination of the foregoing. In further embodiments, the patterned masking layer may be stripped away.

Figure 21:
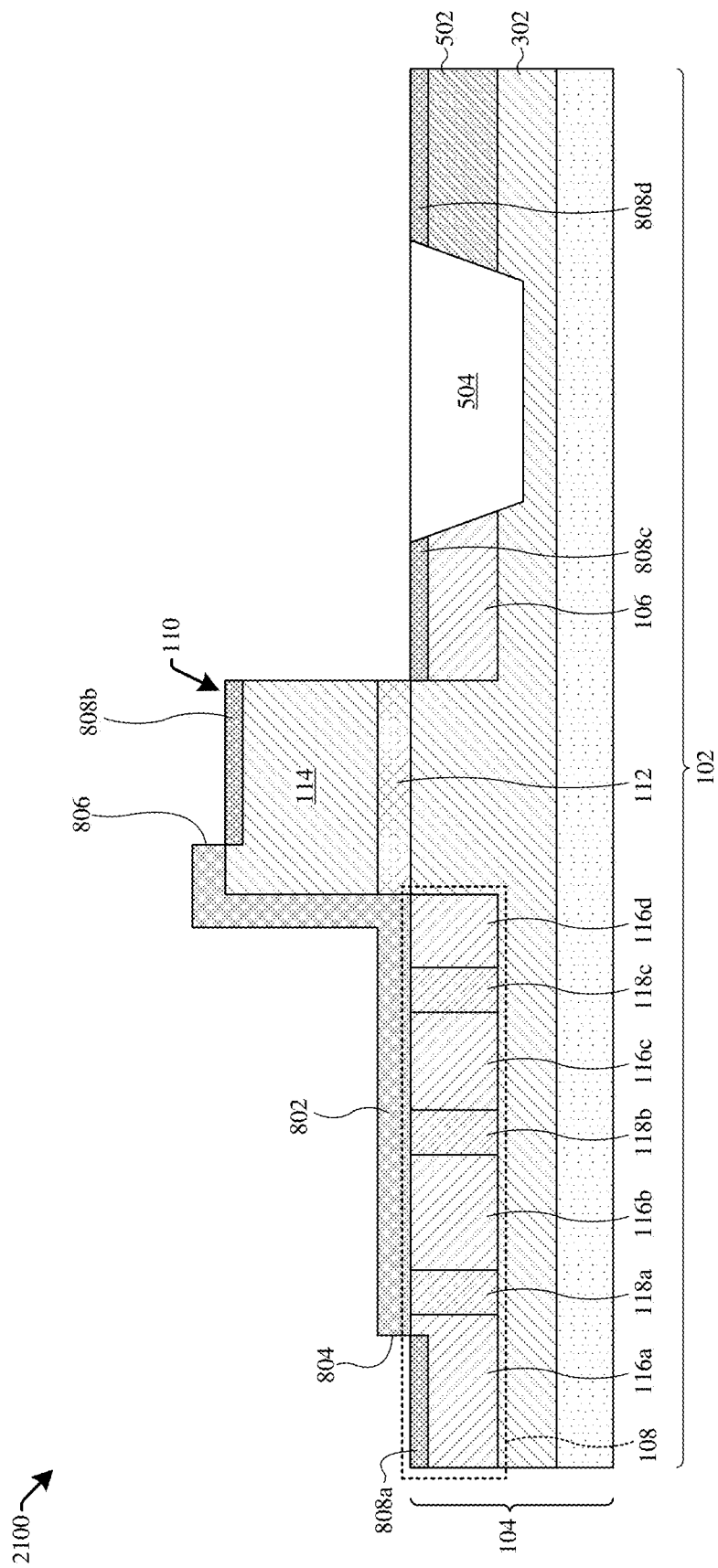

As shown in cross-sectional view 2100 of FIG. 21, a plurality of silicide structures 808 are formed on the substrate 104 and the conductive gate electrode 114. For example, the silicide structures 808 comprise a first silicide structure 808*a* on the first doped region 116*a*, a second silicide structure 808*b* on the conductive gate electrode 114, a third silicide structure 808*c* on the source region 106, and a fourth silicide structure 808*d* on the pick-up region 502.

In some embodiments, a process for forming the silicide structures 808 comprises depositing (e.g., via CVD, PVD, ALD, sputtering, electrochemical plating, electroless plating, or the like) a transition metal layer (not shown) covering the substrate 104, the gate stack 110, and the isolation structure 504. The transition metal layer may be or comprise, for example, nickel (Ni), titanium (Ti), platinum (Pt), tungsten (W), some other metal, or a combination of the foregoing. Subsequently, the transition metal layer is heated so that it reacts with exposed portions of the substrate 104 and the conductive gate electrode 114 to form the silicide structures 808. The silicide blocking layer 802 prevents the transition metal from reacting with portions of the substrate 104 and the conductive gate electrode 114 in which it covers. In some embodiments, the process comprises removing (e.g., via an etching process) unreacted material of the transition metal layer. In further embodiments, the process may be a self-aligned silicide process (e.g., a salicide process). In yet further embodiments, formation of the silicide structures 808 completes formation of the semiconductor device 102.

Figure 22:
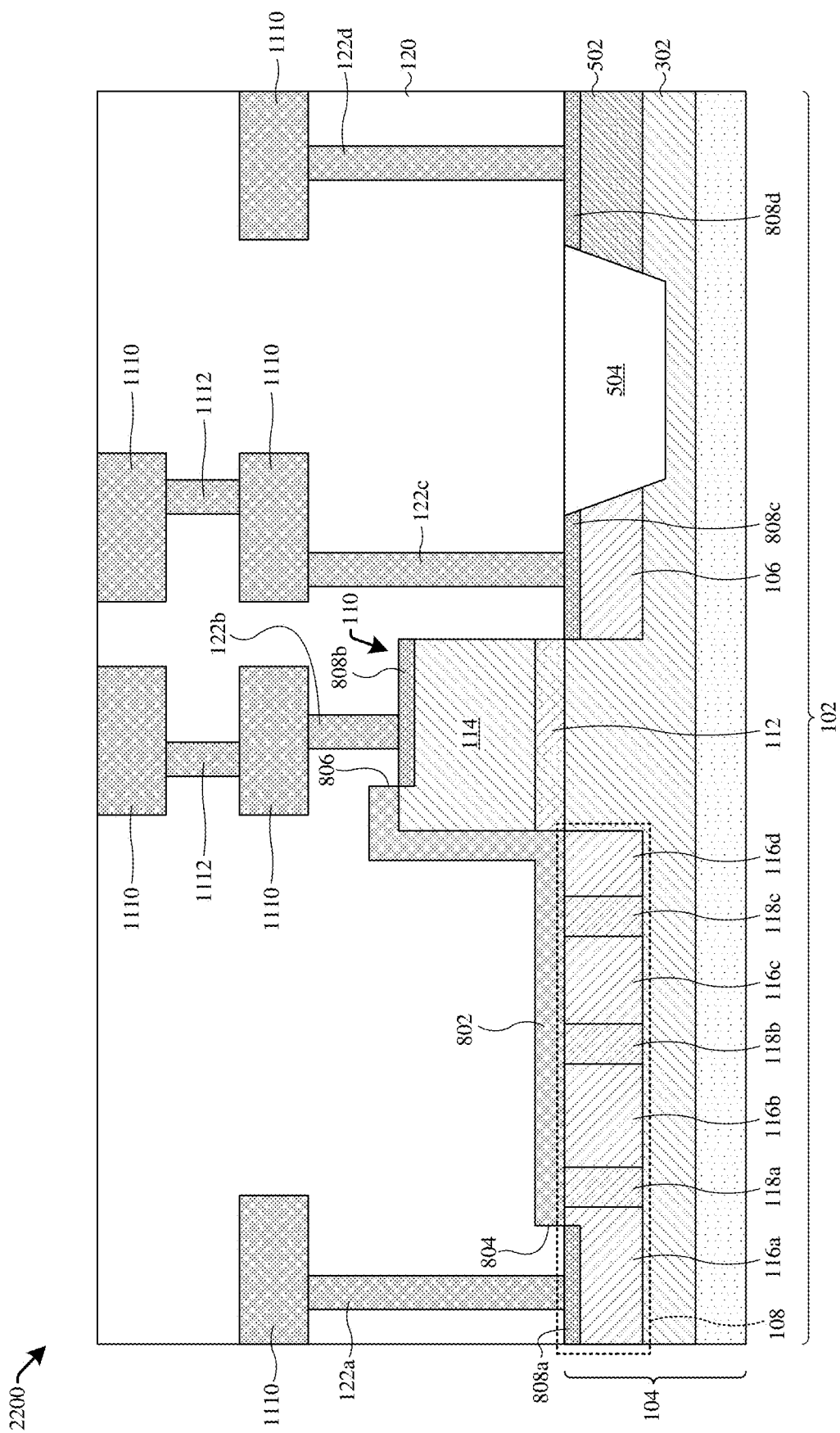

As shown in cross-sectional view 2200 of FIG. 22, an ILD structure 120 is formed over the substrate 104, the silicide structures 808, the silicide blocking layer 802, and the isolation structure 504. The ILD structure 120 comprises one or more stacked ILD layers. Also shown in the cross-sectional view 2200 of FIG. 22, a plurality of conductive contacts 122, a plurality of conductive wires 1110 (e.g., metal wires), and a plurality of conductive vias (e.g., metal vias) are formed in the ILD structure 120.

In some embodiments, a process for forming the ILD structure 120, the conductive contacts 122, the conductive wires 1110, and the conductive vias 1112 comprises forming a first ILD layer over the substrate 104, the silicide structures 808, the silicide blocking layer 802, and the isolation structure 504. Thereafter, contact openings are formed in the first ILD layer. A conductive material (e.g., tungsten (W)) is then formed on the first ILD layer and in the contact openings. Thereafter, a planarization process (e.g., CMP) is performed into the conductive material to form the conductive contacts 122 in the first ILD layer. A second ILD layer is then formed over the first ILD layer and the conductive contacts 122. A plurality of trenches are then formed in the second ILD layer. A conductive material (e.g., copper (Cu)) is formed on the second ILD layer and in the trenches. Thereafter, a planarization process (e.g., CMP) is performed into the conductive material to form some of the conductive wires 1110.

Thereafter, the conductive vias 1112 and the remaining conductive wires 1110 may be formed by repeating a damascene process (e.g., a single damascene process or a dual damascene process) until each of the conductive vias 1112 and each of the conductive wires 1110 are formed in the ILD structure 120. The damascene process is performed by depositing a subsequent ILD layer over the second ILD layer and the some of the conductive wires 1110, etching the subsequent ILD layer to form one or more via holes and/or one or more trenches in the subsequent ILD layer, and filling the one or more via holes and/or the one or more trenches with a conductive material (e.g., copper (Cu)). Thereafter, a planarization process (e.g., CMP) is performed on the conductive material, thereby forming some of the conductive vias 1112 and some more of the conductive wires 1110 in the subsequent ILD layer. This damascene process is repeated until each of the conductive vias 1112 and each of the conductive wires 1110 are formed in the ILD structure 120. The ILD layers may be formed by, for example, CVD, PVD, ALD, some other deposition process, or a combination of the foregoing. The conductive material(s) (e.g., tungsten (W), copper (Cu), etc.) may be formed using a deposition process (e.g., CVD, PVD, sputtering, etc.) and/or a plating process (e.g., electrochemical plating, electroless plating, etc.).

Figure 23:
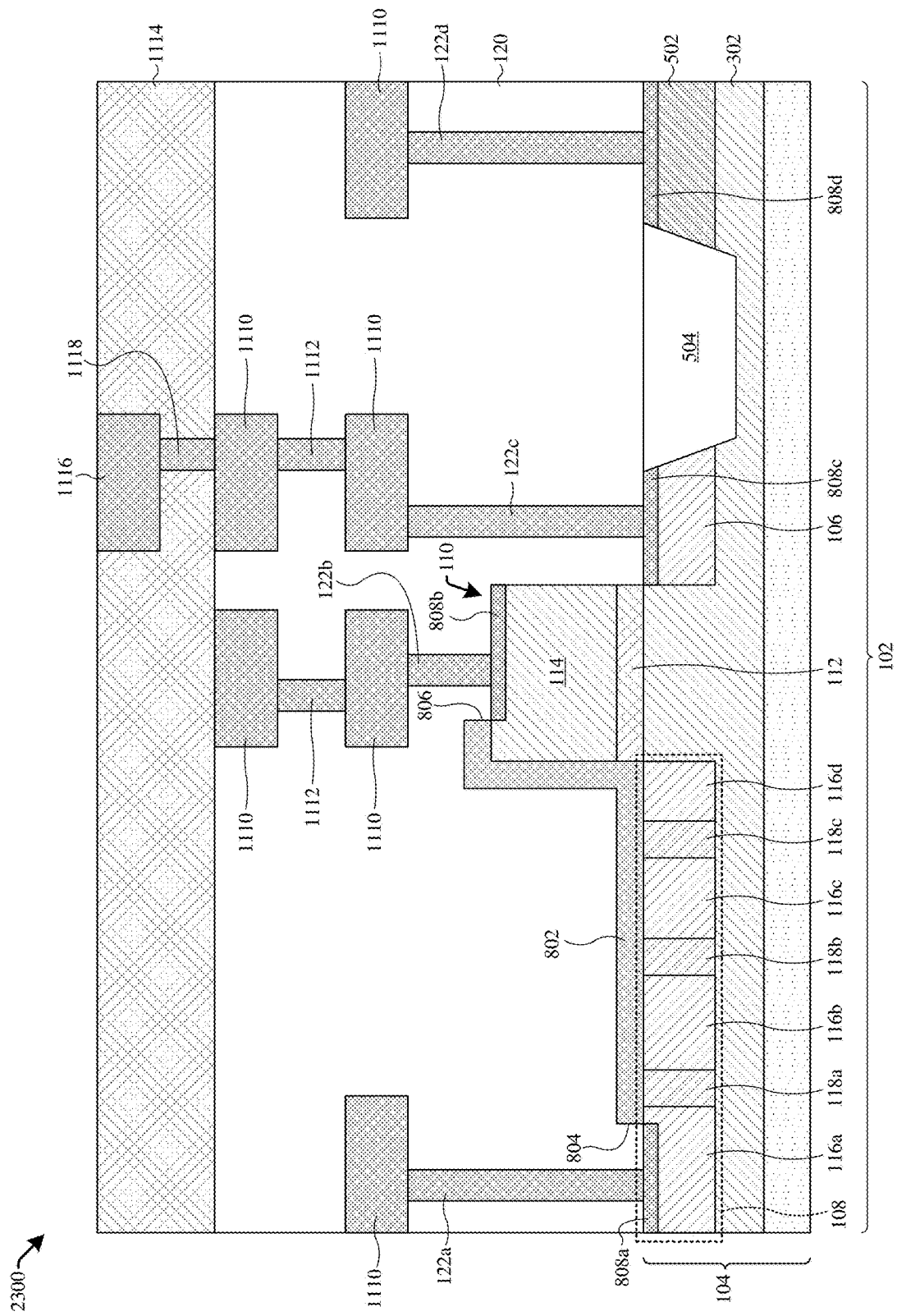

As shown in cross-sectional view 2300 of FIG. 23, a passivation layer 1114 is formed over the ILD structure 120, the substrate 104, the conductive contacts 122, the conductive wires 1110, and the conductive vias 1112. Also shown in the cross-sectional view 2300 of FIG. 23, one or more I/O structures 1116 (e.g., bond pads, solder bumps, etc.) and one or more upper conductive vias 1118 are formed in the passivation layer 1114.

In some embodiments, a process for forming the passivation layer 1114, the I/O structures 1116, and the upper conductive vias 1118 comprises depositing the passivation layer 1114 over the ILD structure 120. The passivation layer 1114 may be deposited by, for example, CVD, PVD, ALD, some other deposition process, or a combination of the foregoing. Thereafter, the I/O structures 1116 and the upper conductive vias 1118 are formed in the passivation layer 1114 by, for example, a damascene process (e.g., a single damascene process or a dual damascene process). The damascene process comprises etching the passivation layer 1114 to form one or more upper via holes and/or one or more I/O openings in the passivation layer 1114, and filling the one or more upper via holes and/or the one or more I/O openings with one or more conductive materials (e.g., gold (Au)). Thereafter, a planarization process (e.g., CMP) is performed on the conductive material, thereby forming the I/O structures 1116 and the upper conductive vias 1118 in the passivation layer 1114. In some embodiments, formation of the I/O structures 1116 completes formation of the IC.

Figure 24:
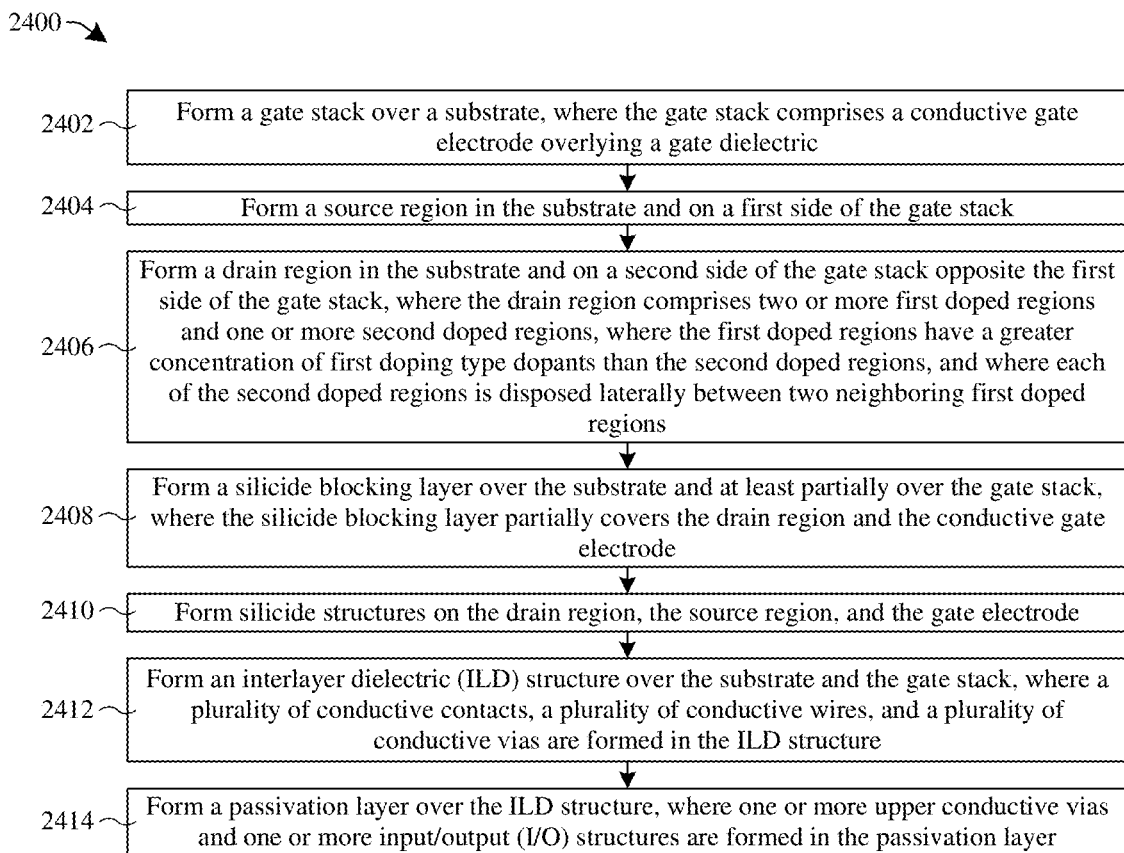
FIG. 24 illustrates a flowchart of some embodiments of a method for forming an IC comprising a semiconductor device that has improved ESD performance.

FIG. 24 illustrates a flowchart 2400 of some embodiments of a method for forming an integrated chip (IC) comprising a semiconductor device that has improved ESD performance. While the flowchart 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2402, a gate stack is formed over a substrate, where the gate stack comprises a conductive gate electrode overlying a gate dielectric. FIGS. 14-17 illustrate a series of cross-sectional views 1400-1700 of some embodiments corresponding to act 2402.

At act 2404, a source region is formed on a first side of the gate stack. FIGS. 18-19 illustrate a series of cross-sectional views 1800-1900 of some embodiments corresponding to act 2404.

At act 2406, a drain region is formed in the substrate and on a second side of the gate stack opposite the first side of the gate stack, where the drain region comprises two or more first doped regions and one or more second doped regions, where the first doped regions have a greater concentration of first doping type dopants than the second doped regions, and where each of the second doped regions is disposed laterally between two neighboring first doped regions. FIGS. 18-19 illustrate a series of cross-sectional views 1800-1900 of some embodiments corresponding to act 2406.

At act 2408, a silicide blocking layer is formed over the substrate and at least partially over the gate stack, where the silicide blocking layer partially covers the drain region and the gate stack. FIG. 20 illustrates a cross-sectional view 2000 of some embodiments corresponding to act 2408.

At act 2410, suicide structures are formed on the drain region, the source region, and the gate electrode. FIG. 21 illustrates a cross-sectional view 2100 of some embodiments corresponding to act 2410.

At act 2412, an interlayer dielectric (ILD) structure is formed over the substrate and the gate stack, where a plurality of conductive contacts, a plurality of conductive wires, and a plurality of conductive vias are formed in the ILD structure. FIG. 22 illustrates a cross-sectional view 2200 of some embodiments corresponding to act 2412.

At act 2414, a passivation layer is formed over the ILD structure, where one or more upper conductive vias and one or more input/output (I/O) structures are formed in the passivation layer. FIG. 23 illustrates a cross-sectional view 2300 of some embodiments corresponding to act 2414.

In some embodiments, the present application provides an integrated chip. The integrated chip comprises a pair of phase detection autofocus (PDAF) photodetectors disposed in a semiconductor substrate, wherein the pair of PDAF photodetectors comprises a first PDAF photodetector and a second PDAF photodetector laterally spaced from the first PDAF photodetector, and wherein a first side of the first PDAF photodetector faces a first side of the second PDAF photodetector. A first electromagnetic radiation (EMR) diffuser is disposed along a back-side of the semiconductor substrate and within a perimeter of the first PDAF photodetector, wherein the first EMR diffuser is laterally spaced a first distance from the first side of the first PDAF photodetector, wherein the first EMR diffuser is laterally spaced a second distance less than the first distance from a second side of the first PDAF photodetector, and wherein the second side of the first PDAF photodetector is opposite the first side of the first PDAF photodetector. A second EMR diffuser is disposed along the back-side of the semiconductor substrate and within a perimeter of the second PDAF photodetector, wherein the second EMR diffuser is laterally spaced a third distance from the first side of the second PDAF photodetector, wherein the second EMR diffuser is laterally spaced a fourth distance less than the third distance from a second side of the second PDAF photodetector, and wherein the second side of the second PDAF photodetector is opposite the first side of the second PDAF photodetector.

In some embodiments, the present application provides a semiconductor device. The semiconductor device comprises a source region in a substrate. A drain region is in the substrate and laterally spaced from the source region. A gate stack is over the substrate and between the source region and the drain region. The drain region comprises two or more first doped regions having a first doping type in the substrate. Further, the drain region comprises one or more second doped regions in the substrate. The first doped regions have a greater concentration of first doping type dopants than the second doped regions. Each of the second doped regions is disposed laterally between two neighboring first doped regions.

In some embodiments, the present application provides a semiconductor device. The semiconductor device comprises a well region in a semiconductor substrate, wherein the well region has a first doping type. A source region is in the well region, wherein the source region has a second doping type opposite the first doping type. A drain region is in the well region and laterally spaced from the source region, wherein the drain region has the second doping type. A gate electrode is disposed over the semiconductor substrate and between the source region and the drain region. The drain region comprises a first number of first doped regions having the first doping type in the semiconductor substrate. Further, the drain region comprises a second number of second doped regions in the semiconductor substrate. The first number is any integer greater than or equal to two. The second number is an integer that is equal to the first number minus one. The first doped regions have a greater concentration of first doping type dopants than the second doped regions. Each of the second doped regions contact two of the first doped regions.

In some embodiments, the present application provides a method for forming a semiconductor device. The method comprises forming a gate stack over a semiconductor substrate. A source region is formed in the semiconductor substrate and on a first side of the gate stack. A drain region is formed in the semiconductor substrate and on a second side of the gate stack opposite the first side, wherein forming the drain region comprises: 1) forming a patterned masking layer over the semiconductor substrate, wherein the patterned masking layer comprises a plurality of openings disposed on the second side of the gate stack; and 2) implanting one or more dopant species into the semiconductor substrate through the plurality of openings of the patterned masking layer. A silicide blocking layer is formed that at least partially covers the drain region and the gate stack. With the silicide blocking layer partially covering the drain region and the gate stack, performing a silicide process on the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
    forming a gate stack over a semiconductor substrate;
    forming a source region in the semiconductor substrate and on a first side of the gate stack;
    forming a drain region comprising a plurality of drain segments, wherein the drain region is formed in the semiconductor substrate and on a second side of the gate stack opposite the first side, and wherein forming the drain region comprises:
        forming a patterned masking layer over the semiconductor substrate, wherein the patterned masking layer comprises a plurality of openings disposed on the second side of the gate stack; and
        implanting first doping type dopants into the semiconductor substrate through the plurality of openings of the patterned masking layer to form the plurality of drain segments individual to and respectively underlying the plurality of openings;
    forming a silicide blocking layer over the semiconductor substrate, wherein the silicide blocking layer at least partially covers the drain region;
    with the silicide blocking layer in place over the semiconductor substrate, performing a silicide process on the semiconductor substrate to form a silicide structure partially over the drain region; and
    forming a conductive contact overlying the drain region;
    wherein the plurality of drain segments are spaced from each other after the forming of the conductive contact, wherein the plurality of drain segments comprise a distal drain segment that is farthest from the gate stack amongst the plurality of drain segments, wherein the conductive contact overlies the distal drain segment, and wherein a remainder of the plurality of drain segments are completely covered by the silicide blocking layer after the forming of the conductive contact.

2. The method of claim 1, wherein the plurality of openings comprises a first opening, a second opening, and a third opening.

3. The method of claim 2, further comprising:
    forming an interlayer dielectric (ILD) structure over the semiconductor substrate and the gate stack;
    wherein the conductive contact is formed in the ILD structure and extends vertically from the drain region, wherein the conductive contact overlies a portion of the drain region, wherein the portion of the drain region is laterally spaced from the gate stack by a first distance, wherein the second opening is formed laterally spaced from the gate stack by a second distance less than the first distance, and wherein the first opening is formed laterally between the second opening and the gate stack.

4. The method of claim 2, wherein:
    the silicide process forms the silicide structure over a portion of the drain region;
    the portion of the drain region is laterally spaced from the gate stack by a first distance;
    the second opening is formed laterally spaced from the gate stack by a second distance less than the first distance; and
    the first opening is formed laterally between the second opening and the gate stack.

5. The method of claim 1, wherein each of the openings of the plurality of openings are laterally spaced from one another.

6. The method of claim 1, further comprising:
    forming a doped well region in the semiconductor substrate, wherein the gate stack is formed overlying the doped well region, and wherein both the source region and the drain region are formed in the doped well region.

7. The method of claim 6, further comprising:
    forming an isolation structure in the doped well region, wherein the source region is formed laterally between the isolation structure and the gate stack.

8. The method of claim 1, further comprising:
    removing the patterned masking layer.

9. The method of claim 1, wherein the silicide blocking layer has a first sidewall overlying the distal drain segment, laterally offset from edges of the distal drain segment, and further has a second sidewall overlying the gate stack, laterally offset from edges of the gate stack.

10. The method of claim 1, wherein the silicide process forms another silicide structure partially over the gate stack.

11. A method for forming an integrated chip (IC), the method comprising:
    forming a gate dielectric structure over a semiconductor substrate;
    forming a gate electrode structure overlying the gate dielectric structure;
    forming a patterned masking layer over the semiconductor substrate, wherein the patterned masking layer comprises a plurality of drain openings on a first side of the gate dielectric structure and a source opening on a second side of the gate dielectric structure, wherein the second side of the gate dielectric structure is opposite the first side of the gate dielectric structure, and wherein each of the plurality of drain openings are formed on the first side of the gate dielectric structure;
    with the patterned masking layer in place, performing a doping process to selectively implant first doping type dopants into the semiconductor substrate through the plurality of drain openings and through the source opening, thereby forming a drain region in the semiconductor substrate and on the first side of the gate dielectric structure and forming a source region in the semiconductor substrate and on the second side of the gate dielectric structure;
    after the doping process is performed, removing the patterned masking layer;
    after the patterned masking layer is removed, forming a silicide blocking layer over the semiconductor substrate and partially covering the drain region; and
    with the silicide blocking layer in place over the semiconductor substrate, performing a silicide process on the semiconductor substrate to form a first silicide structure partially over the drain region.

12. The method of claim 11, wherein:
the drain openings of the plurality of drain openings expose portions of the semiconductor substrate, respectively; and
the silicide blocking layer is formed covering, at least partially, each of the portions of the semiconductor substrate.

13. The method of claim 11, wherein the doping process is an ion implantation process.

14. The method of claim 11, wherein:
the silicide blocking layer is formed partially covering the gate electrode structure;
the silicide process forms a second silicide structure partially over the gate electrode structure; and
the silicide process forms a third silicide structure over the source region.

15. The method of claim 11, wherein:
the plurality of drain openings comprises a first drain opening, wherein the first drain opening of the plurality of drain openings is disposed further from the gate dielectric structure than each of the other drain openings of the plurality of drain openings;
the first drain opening exposes a portion of the semiconductor substrate; and
the silicide blocking layer is formed with a sidewall disposed between opposite sides of the portion of the semiconductor substrate.

16. The method of claim 15, wherein:
the silicide blocking layer extends continuously from the sidewall of the silicide blocking layer to the gate dielectric structure.

17. The method of claim 15, further comprising:
forming an interlayer dielectric (ILD) structure over the semiconductor substrate, the gate electrode structure, the gate dielectric structure, and the silicide blocking layer, wherein the first silicide structure is formed on the portion of the semiconductor substrate; and
forming a conductive contact in the ILD structure and extending vertically from the first silicide structure.

18. A method for forming a semiconductor device, the method comprising:
forming a doped well region in a semiconductor substrate by doping the semiconductor substrate with first doping type dopants;
forming a gate stack over the semiconductor substrate and overlying the doped well region;
forming a source region in the doped well region and on a first side of the gate stack;
forming a drain region in the doped well region and on a second side of the gate stack opposite the first side, wherein forming the drain region comprises:
forming a patterned masking layer over the semiconductor substrate, wherein the patterned masking layer comprises a plurality of openings disposed on the second side of the gate stack, wherein the plurality of openings comprises a first opening and a second opening, wherein the first opening exposes a first portion of the doped well region, wherein the second opening exposes a second portion of the doped well region, and wherein a portion of the patterned masking layer covers a third portion of the doped well region that extends laterally between the first portion of the doped well region and the second portion of the doped well region; and
doping the semiconductor substrate through the plurality of openings with second doping type dopants, thereby respectively forming a plurality of doped segments in the doped well region, wherein a doping type of the second doping type dopants is opposite a doping type of the first doping type dopants.

19. The method of claim 18, further comprising:
forming a silicide blocking layer over the semiconductor substrate, wherein the silicide blocking layer is formed covering a first doped segment of the plurality of doped segments, covering the third portion of the doped well region, and partially covering a second doped segment of the plurality of doped segments, wherein the third portion of the doped well region extends laterally between the first doped segment and the second doped segment; and
with the silicide blocking layer in place over the semiconductor substrate, performing a silicide process on the semiconductor substrate to form a silicide structure over the second doped segment.

20. The method of claim 19, further comprising:
forming an interlayer dielectric (ILD) structure over the semiconductor substrate, the gate stack, the silicide blocking layer, and the silicide structure; and
forming a conductive contact in the ILD structure and extending vertically from the silicide structure, wherein the conductive contact is formed so that a sidewall of the silicide blocking layer is disposed laterally between the conductive contact and the third portion of the doped well region.

* * * * *